(12) United States Patent
Otake

(10) Patent No.: US 11,705,513 B2
(45) Date of Patent: Jul. 18, 2023

(54) NITRIDE SEMICONDUCTOR DEVICE

(71) Applicant: ROHM CO., LTD., Kyoto (JP)

(72) Inventor: Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/752,667

(22) Filed: May 24, 2022

(65) Prior Publication Data

US 2022/0285541 A1 Sep. 8, 2022

Related U.S. Application Data

(63) Continuation of application No. 16/780,462, filed on Feb. 3, 2020, now Pat. No. 11,374,121.

(30) Foreign Application Priority Data

Feb. 4, 2019 (JP) ................................. 2019-018211

(51) Int. Cl.
*H01L 29/66* (2006.01)
*H01L 29/778* (2006.01)
(Continued)

(52) U.S. Cl.
CPC .......... *H01L 29/7787* (2013.01); *H01L 24/45* (2013.01); *H01L 29/0847* (2013.01); *H01L 29/2003* (2013.01); *H01L 29/66462* (2013.01)

(58) Field of Classification Search
CPC ............. H01L 29/2003; H01L 29/7787; H01L 29/1066; H01L 29/432; H01L 29/66462
See application file for complete search history.

(56) References Cited

U.S. PATENT DOCUMENTS

2006/0273347 A1 12/2006 Hikita et al.
2010/0155720 A1* 6/2010 Kaneko ............... H01L 29/7786
257/E29.1
(Continued)

FOREIGN PATENT DOCUMENTS

JP 2006339561 12/2006
JP 2012038966 A 2/2012
(Continued)

OTHER PUBLICATIONS

Notice of Reasons for Refusal issued for Japanese Patent Application No. 2019-018211, dated Oct. 6, 2022, 10 pages including English machine translation.

(Continued)

*Primary Examiner* — Jaehwan Oh
(74) *Attorney, Agent, or Firm* — Hamre, Schumann, Mueller & Larson, P.C.

(57) ABSTRACT

A nitride semiconductor device 1 includes a first transistor 3 which is constituted of a normally-off transistor and functions as a main transistor and a second transistor 4 which is constituted of a normally-on transistor and arranged to limit a gate current of the first transistor. The first transistor 3 includes a first electron transit layer 7A constituted of a nitride semiconductor and a first electron supply layer 8A which is formed on the first electron transit layer and constituted of a nitride semiconductor. The second transistor 4 includes a second electron transit layer 7B constituted of a nitride semiconductor and a second electron supply layer 8B which is formed on the second electron transit layer and constituted of a nitride semiconductor. A gate electrode 51 and a source electrode 44 of the second transistor 4 are electrically connected to a gate electrode 16 of the first transistor 3.

17 Claims, 20 Drawing Sheets

(51) Int. Cl.
*H01L 29/20* (2006.01)
*H01L 23/00* (2006.01)
*H01L 29/08* (2006.01)

(56) References Cited

U.S. PATENT DOCUMENTS

| | | | |
|---|---|---|---|
| 2014/0015591 A1* | 1/2014 | Chen | H01L 27/095 |
| | | | 327/380 |
| 2020/0194580 A1* | 6/2020 | Abe | H01L 29/2003 |

FOREIGN PATENT DOCUMENTS

| | | |
|---|---|---|
| JP | 2015529019 A | 10/2015 |
| JP | 5804802 | 11/2015 |
| JP | 2016171259 A | 9/2016 |
| JP | 2017073506 | 4/2017 |

OTHER PUBLICATIONS

Notice of Reasons for Refusal issued for Japanese Patent Application No. 2019-018211, dated Feb. 16, 2023, 5 pages including English machine translation.

* cited by examiner

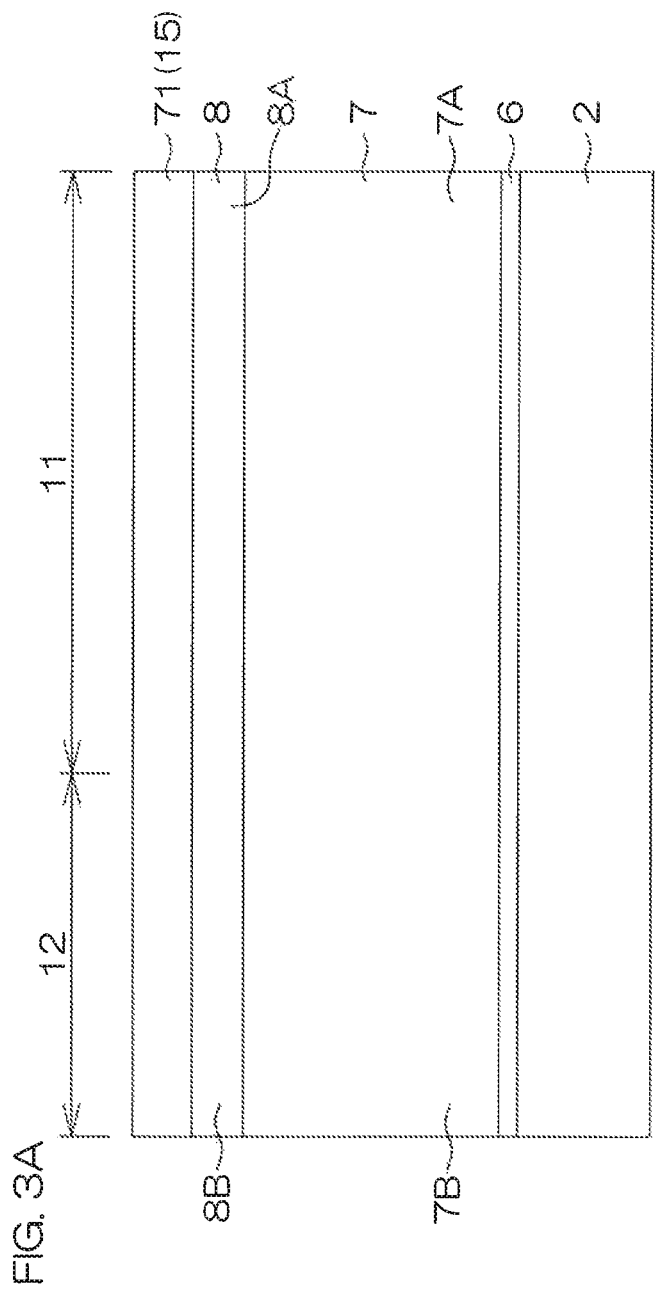

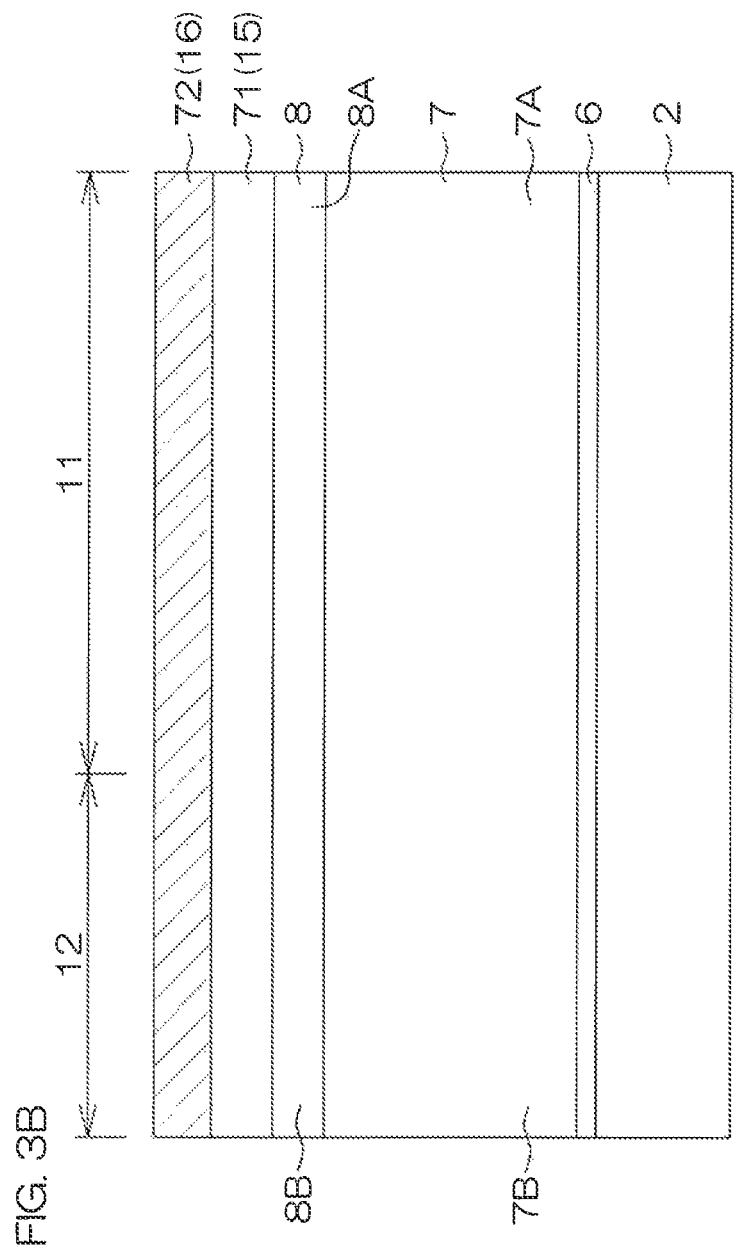

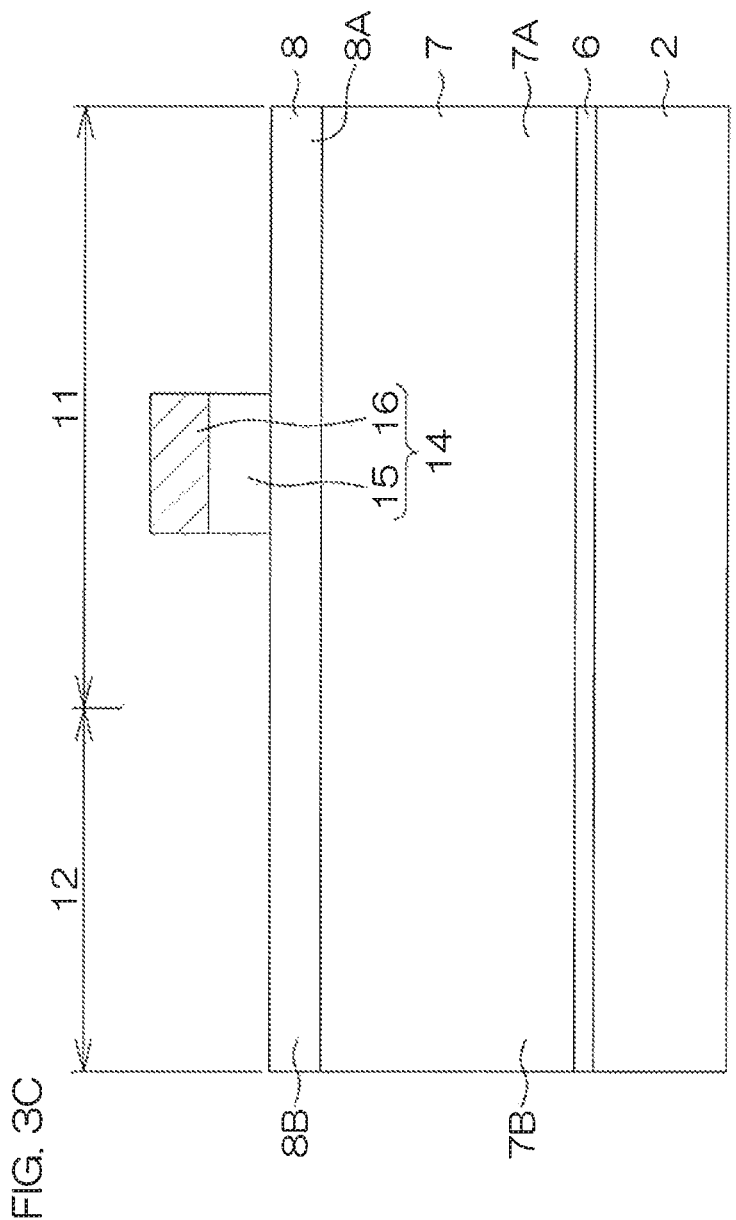

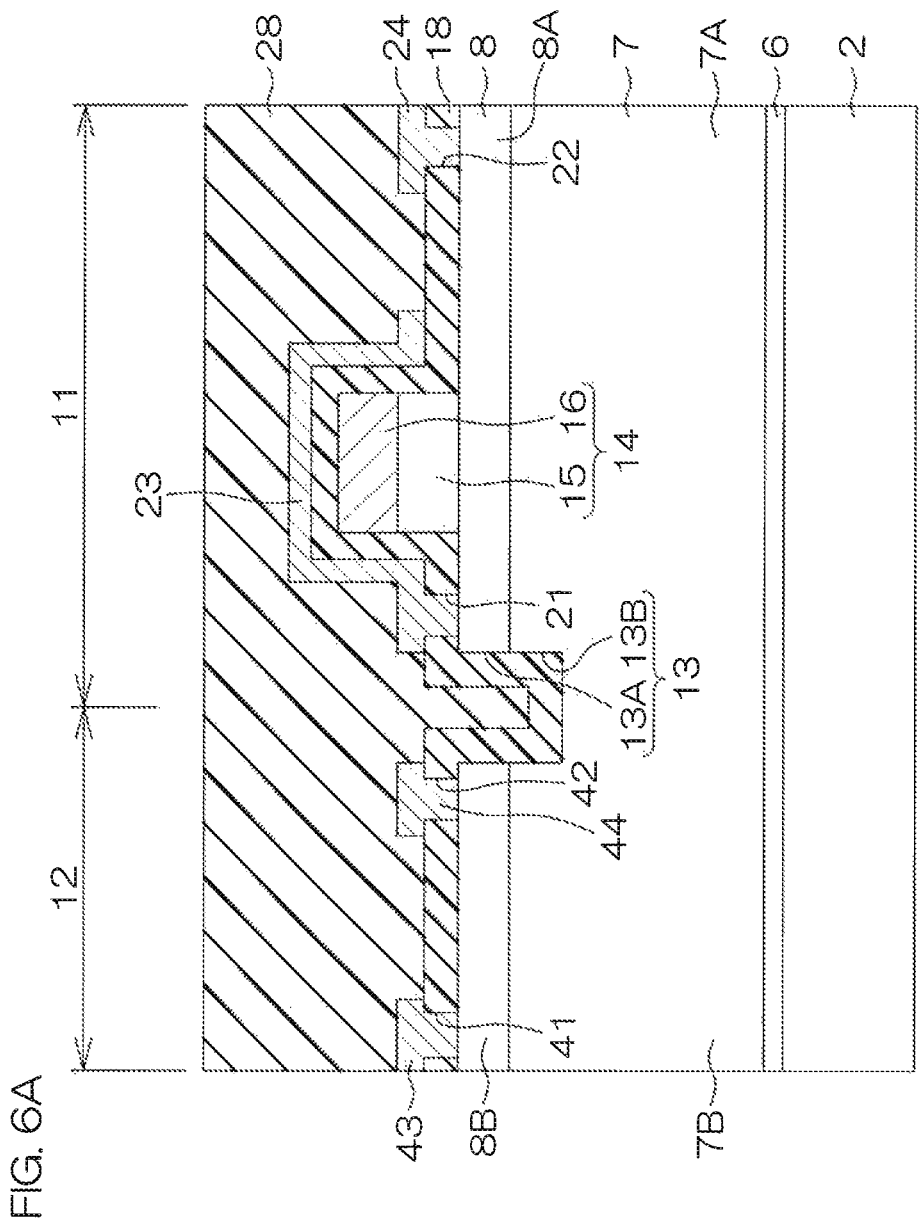

NITRIDE SEMICONDUCTOR DEVICE

CROSSREFERENCE TO RELATED APPLICATIONS

This application claims the benefit of priority to Japanese Patent Application No 2019-018211 filed on 4 Feb. 2019. The entire contents of this application are hereby incorporated herein by reference.

BACKGROUND OF THE INVENTION

1. Field of the Invention

The present invention relates to a nitride semiconductor device which is constituted of a group III nitride semiconductor (hereinafter sometimes referred to simply as "nitride semiconductor" in some cases).

2. Description of the Related Art

A group III nitride semiconductor is a semiconductor with which nitrogen is used as a group V element in a group III-V semiconductor. Representative examples are aluminum nitride. (AlN), gallium nitride (GaN), and indium nitride (InN). The semiconductor can be expressed generally as $Al_xIn_yGa_{1-x-y}N$ ($0 \leq x \leq 1$, $0 \leq y \leq 1$, $0 \leq x+y \leq 1$).

An HEMT (High Electron Mobility Transistor) using such a nitride semiconductor has been proposed. Such an HEMT includes, for example, an electron transit layer constituted of GaN and an electron supply layer constituted of AlGaN that is grown epitaxially on the electron transit layer. A pair of source electrode and drain electrode are formed to be in contact with the electron supply layer, and a gate electrode is disposed therebetween.

Due to polarization caused by lattice mismatch of GaN with AlGaN, a two-dimensional electron gas is formed inside the electron transit layer at a position located only by a few Å inward from an interface between the electron transit layer and the electron supply layer. The source and the drain are connected to each other with the two-dimensional electron gas as a channel. When the two-dimensional electron gas is cut off by application of a control voltage to the gate electrode, the source and the drain are cut off from each other. The source and the drain are continuous to each other in a state where the control voltage is not applied to the gate electrode and, therefore, the device is of a normally-on type.

Devices using a nitride semiconductor have features of high withstand voltage, high temperature operation, high current density, high speed switching and low on resistance and are, thus, being examined for application to power devices.

However, for use as a power device, a device must be of a normally-off type in which current is cut off in a zero-bias state, and therefore, an HEMT such as described above cannot be applied to a power device.

A structure for realizing a nitride semiconductor HEMT of the normally-off type has been proposed, for example, in Japanese Unexamined Patent Application Publication No. 2017-73506.

SUMMARY OF THE INVENTION

Japanese Unexamined Patent Application Publication No. 2006-339561 discloses an arrangement where a p type GaN gate layer (nitride semiconductor gate layer) is laminated on an AlGaN electron supply layer, a gate electrode is disposed thereon, and a channel is eliminated by a depletion layer spreading from the p type GaN gate layer to realize a normally-off type.

However, in the above-described gate structure, a diode is formed with the AlGaN electron supply layer and the p type GaN gate layer and a diode is also formed with the p type GaN gate layer and the gate electrode. Therefore, where a large gate voltage is applied to a gate, the diodes are both turned on, thus resulting in an excessively large current which flows between the gate and a source. Then, there is a concern of an increase in loss of a gate control circuit or the gate portion or the wiring pattern may be damaged by overheating.

The above-described phenomena occur due to a surge voltage generated in a gate control circuit at the time of switching of an HEMT, where a conduction path of the gate control circuit has a large parasitic inductance. It is noted that a surge voltage is given as a product of a variation rate of gate current per time and a parasitic inductance.

Thus, Japanese Patent No. 5804802 has disclosed that a protection diode is formed between a gate and source of an HEMT to suppress a large current from flowing between the gate and the source due to a surge voltage. However, according to Japanese Patent No. 5804802, a MIS (metal insulator semiconductor) structure which includes an SiN insulating layer is used as a protection diode and, therefore, the protection diode is easily influenced by variation in characteristics due to the composition of the SiN insulating layer and stress. Therefore, such a problem is found that it is difficult to produce a protection diode having stable characteristics.

An object of the present invention is to provide a nitride semiconductor device capable of suppressing an excessively large current from flowing in a gate.

In order to overcome the previously unrecognized and unsolved challenges described above, a preferred embodiment of the present invention provides a nitride semiconductor which includes a first transistor that is constituted of a normally-off transistor and functions as a main transistor and a second transistor that is constituted of a normally-on transistor and arranged to limit a gate current of the first transistor, in which the first transistor includes a first electron transit layer constituted of a nitride semiconductor and a first electron supply layer which is formed on the first electron transit layer and constituted of a nitride semiconductor, the second transistor includes a second electron transit layer constituted of a nitride semiconductor and a second electron supply layer which is formed on the second electron transit layer and constituted of a nitride semiconductor, and a gate electrode and a source electrode of the second transistor are electrically connected to a gate electrode of the first transistor.

The second transistor is a normally-on transistor and therefore, in terms of the drain current characteristics with respect to a drain-source voltage, saturation region which limits a drain current is present in a high drain-source voltage region. Therefore, even upon occurrence of a large drain-source voltage of the second transistor by parasitic inductance inside the gate control circuit at the time of switching of the first transistor, a drain current of the second transistor is limited by the saturation region of the drain current characteristics with respect to the drain-source voltage. It is, thereby, possible to suppress an excessively large gate current from flowing in the gate electrode of the first transistor.

In a preferred embodiment of the present invention, the first transistor and the second transistor are formed on the same substrate.

In a preferred embodiment of the present invention, the first electron transit layer leads to the second electron transit layer on the substrate.

In a preferred embodiment of the present invention, a first nitride semiconductor layer which constitutes the first electron transit layer and the second electron transit layer is formed on the substrate. A second nitride semiconductor layer which constitutes the first electron supply layer and the second electron supply layer is formed on the first nitride semiconductor layer. On a front surface of the second nitride semiconductor layer, there is formed a separation groove for separating a first region in which the first transistor is formed from a second region in which the second transistor is formed, and the separation groove penetrates through the second nitride semiconductor layer and extends to an interior of the first nitride semiconductor layer.

In a preferred embodiment of the present invention, the first transistor has a nitride semiconductor gate layer which is disposed on the first electron supply layer and also contains an acceptor type impurity, and a gate electrode of the first transistor is formed on the nitride semiconductor gate layer.

In a preferred embodiment of the present invention, the second transistor has a gate insulating film formed on the second electron supply layer, and a gate electrode of the second transistor is formed on the gate insulating film.

In a preferred embodiment of the present invention, the gate insulating film has a recessed portion on a front surface thereof on the side opposite the second electron supply layer, and the gate electrode of the second transistor has a portion which is embedded in the recessed portion and a field plate portion which is formed on the front surface of the gate insulating film at a peripheral edge of the recessed portion.

In a preferred embodiment of the present invention, the gate electrode of the second transistor has the same material as a source wiring and a drain wiring of the second transistor.

In a preferred embodiment of the present invention, the first electron transit layer and the second electron transit layer are constituted of a GaN layer, and first electron supply layer and the second electron supply layer include an AlGaN layer.

In a preferred embodiment of the present invention, the first electron transit layer and the second electron transit layer are constituted of a GaN layer, the first electron supply layer and the second electron supply layer include an AlGaN layer, and the nitride semiconductor gate layer is constituted of a GaN layer which contains an acceptor type impurity.

In a preferred embodiment of the present invention, the first electron transit layer and the second electron transit layer are constituted of a GaN layer, the first electron supply layer and the second electron supply layer include an AlGaN layer, and the gate insulating film is constituted of an SiN film.

A preferred embodiment of the present invention provides a method for manufacturing a nitride semiconductor device which includes a step of forming on a substrate a first nitride semiconductor layer which constitutes an electron transit layer, a second nitride semiconductor layer which constitutes an electron supply layer and a nitride semiconductor gate layer material film which contains an acceptor type impurity in this order, a step of forming a first gate electrode film on the nitride semiconductor gate layer material film, a step of selectively removing the nitride semiconductor gate layer material film and the first gate electrode film, thereby forming a gate portion which is constituted of a ridge-shaped nitride semiconductor gate layer and a first gate electrode formed on an upper surface of the nitride semiconductor gate layer, a step of forming on a front surface of the second nitride semiconductor layer a separation groove which separates a first transistor forming region from a second transistor forming region, penetrates through the second nitride semiconductor layer and extends to an interior of the first nitride semiconductor layer, a step of forming a first insulating film which covers an inner surface of the separation groove, an exposed surface of the second nitride semiconductor layer and an exposed surface of the gate portion, a step of forming in the first transistor forming region a first source electrode and a first drain electrode which penetrate through the first insulating film to reach the second nitride semiconductor layer and forming in the second transistor forming region a second source electrode and a second drain electrode which penetrate through the first insulating film to reach the second nitride semiconductor layer, a step of forming a second gate electrode on the first insulating film, and a step of electrically connecting the second gate electrode and the second source electrode to the first gate electrode.

According to the manufacturing method, the normally-off type first transistor is formed in the first transistor forming region and the normally-on type second transistor is formed in the second transistor forming region. The second gate electrode and the second source electrode of the second transistor are electrically connected to the first gate electrode of the first transistor.

The second transistor is a normally-on type transistor and therefore, in terms of the drain current characteristics with respect to the drain-source voltage, a saturation region which limits a drain current is present in a high drain-source voltage region. Therefore, even upon occurrence of a large drain-source voltage of the second transistor by parasitic inductance inside the gate control circuit at the time of switching of the first transistor, a drain current of the second transistor is limited by the saturation region of the drain current characteristics with respect to the drain-source voltage. Thereby, it is possible to suppress an excessively large gate current from flowing in the gate electrode of the first transistor.

That is, according to the above-described manufacturing method, there is provided a nitride semiconductor device capable of suppressing an excessively large gate current from flowing in the gate electrode of the first transistor.

In a preferred embodiment of the present invention, the step of forming the second gate electrode includes a step of forming an interlayer insulating film on the first insulating film, a step of forming a gate opening in the interlayer insulating film, and a step of embedding a metal into the gate opening, thereby forming the second gate electrode.

In a preferred embodiment of the present invention, at the same time as the step of forming the gate opening in the interlayer insulating film, in the interlayer insulating film, a first source via-hole, a first drain via-hole, a second source via-hole and a second drain via-hole are formed which respectively reach the first source electrode, the first drain electrode, the second source electrode and the second drain, and the second gate electrode is formed at the same time as the step of embedding a metal into each of the first source via-hole, the first drain via-hole, the second source via-hole and the second drain via-hole, thereby forming a first source wiring, a first drain wiring, a second source wiring and a second drain wiring.

In a preferred embodiment of the present invention, the step of forming the second gate electrode includes a step of forming a second insulating film on the first insulating film so as to cover the first and the second source electrodes as well as the first and the second drain electrodes, a step of forming a gate opening in the second insulating film, and a step of forming the second gate electrode which penetrates through the gate opening to reach the first insulating film, in which the second gate electrode has a field plate portion formed on the second insulating film at a peripheral edge of the gate opening.

In a preferred embodiment of the present invention, the step of forming the second gate electrode includes a step of forming a second insulating film on the first insulating film so as to cover the first and the second source electrodes as well as the first and the second drain electrodes, a step of forming a first gate opening in the second insulating film, a step of forming an interlayer insulating film on the second insulating film, a step of forming in the interlayer insulating film a second gate opening which communicates with the first gate opening, and a step of embedding a metal into a gate opening constituted of the second gate opening and the first gate opening, thereby forming the second gate electrode, in which a width of the second gate opening is larger than that of the first gate opening, and the second gate electrode has a field plate portion formed on the second insulating film at a peripheral edge of the first gate opening.

In a preferred embodiment of the present invention, at the same time as the step of forming the second gate opening in the interlayer insulating film, in a laminated film of the second insulating film and the interlayer insulating film, a first source via-hole, a first drain via-hole a second source via-hole and second drain via-hole are formed which respectively reach the first source electrode, the first drain electrode, the second source electrode and the second drain, and the second gate electrode is formed at the same time as a step of embedding a metal into each of the first source via-hole, the first drain via-hole, the second source via-hole and the second drain via-hole, thereby forming a first source wiring, a first drain wiring, a second source wiring and a second drain wiring.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a sectional view which shows one example of a manufacturing step of the nitride semiconductor device of FIG. 1.

FIG. 3B is a sectional view which shows a step subsequent to that of FIG. 3A.

FIG. 3C is a sectional view which shows a step subsequent to that of FIG. 3B.

FIG. 6A is a sectional view which shows one example of a manufacturing step of the nitride semiconductor device of FIG. 5.

DETAILED DESCRIPTION OF THE PREFERRED EMBODIMENTS

Figure 1:
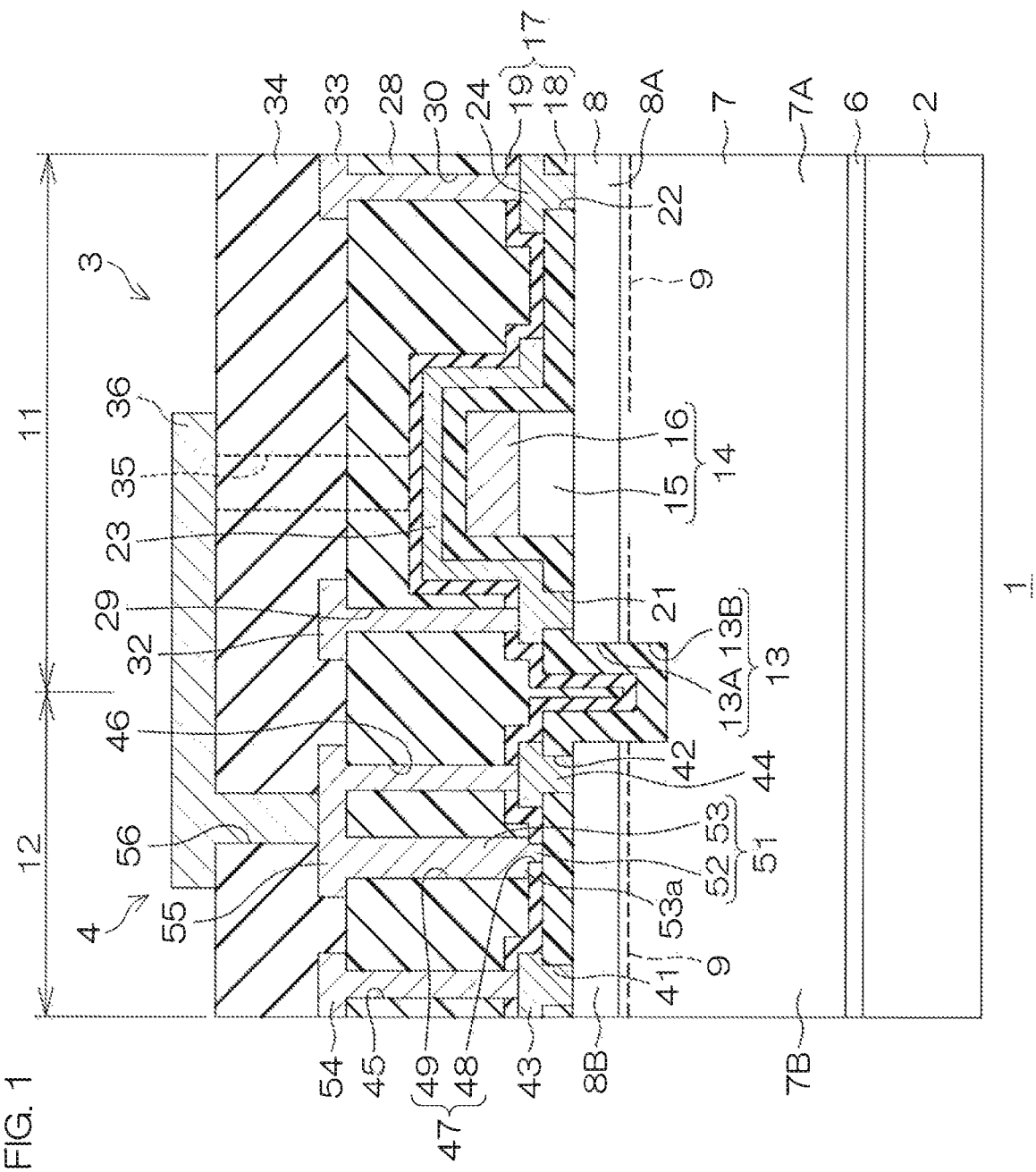
FIG. 1 is a sectional view for describing a constitution of a nitride semiconductor device according to a first preferred embodiment of the present invention.

FIG. 1 is a sectional view for describing a constitution of the nitride semiconductor device according to the first preferred embodiment of the present invention.

The nitride semiconductor device 1 has a first transistor 3 constituted of a normally-off transistor and a second transistor 4 which is constituted of a normally-on transistor and connected to a gate of the first transistor 3. In the first preferred embodiment, the first transistor 3 and the second transistor 4 are formed on the same substrate 2. The first transistor 3 functions as a main transistor. The second transistor 4 functions as a current limiting element for limiting a gate current of the first transistor 3.

A buffer layer 6 is formed on a front surface of the substrate 2. On the buffer layer 6, there is formed a first nitride semiconductor layer 7 which constitutes an electron transit layer of the first transistor 3 and that of the second transistor 4. On the first nitride semiconductor layer there is formed a second nitride semiconductor layer 8 which constitutes an electron supply layer of the first transistor 3 and that of the second transistor 4.

On a front surface of the second nitride semiconductor layer 8, there is formed a separation groove 13 for separating a first transistor forming region (hereinafter, referred to as "a first region 11") from a second transistor forming region (hereinafter, referred to as "a second region 12"). The separation groove 13 extends so as to cross the front surface of the second nitride semiconductor layer 8 in a predetermined one direction (in a thickness direction of the sheet surface of FIG. 1). The separation groove 13 is rectangular in a transverse cross-sectional shape. The separation groove 13 is constituted of a penetration portion 13A which penetrates through the second nitride semiconductor layer 8 and a recessed portion 13B which communicates with the penetration portion 13A and is formed on a surface layer of the first nitride semiconductor layer 7. That is, the separation groove 13 penetrates through the second nitride semiconductor layer 8 and extends to an interior of the first nitride semiconductor layer 7.

The first transistor 3 is formed in the first region 11. The first nitride semiconductor layer 7 within the first region 11 constitutes an electron transit layer (first electron transit layer 7A) of the first transistor 3, and the second nitride semiconductor layer 8 within the first region 11 constitutes an electron supply layer (first electron supply layer 8A) of the first transistor 3.

In the first region 11, a gate portion 14 is formed on the front surface of the second nitride semiconductor layer 8 (first electron supply layer 8A). The gate portion 14 includes a ridge-shaped nitride semiconductor gate layer 15 which is epitaxially grown on the first electron supply layer 8A and also extends in parallel with the separation groove 13 and a first gate electrode 16 which is formed on a front surface of the nitride semiconductor gate layer 15. The first gate electrode 16 is a gate electrode of the first transistor 3.

On the first electron supply layer 8A, there is formed an insulating film 17 which covers an exposed surface of the first electron supply layer 8A, inner surfaces (side surfaces and a bottom surface) of the separation groove 13, the gate portion 14, etc. The insulating film 17 is constituted of a first insulating film 18 on a lower layer side and a second insulating film 19 on an upper layer side which is formed on the first insulating film 18.

A first source contact hole 21 is formed at a region between the gate portion 14 and the separation groove 13 in the first insulating film 18. A first drain contact hole 22 is also formed on the side opposite the first source contact hole 21 with respect to the gate portion 14 in the first insulating film 18.

A first source electrode 23 is formed on the first insulating film 18 so as to cover the first source contact hole 21. The first source electrode 23 penetrates through the first source contact hole 21 to make ohmic contact with the first electron supply layer 8A. The first source electrode 23 covers a lengthwise intermediate portion of the gate portion 14. The first source electrode 23 is a source electrode of the first transistor 3.

Further, a first drain electrode 24 is formed on the first insulating film 18 so as to cover the first drain contact hole 22. The first drain electrode 24 penetrates through the first drain contact hole 22 to make ohmic contact with the first electron supply layer 8A. The first drain electrode 24 is a drain electrode of the first transistor 3.

The second insulating film 19 is formed on the first insulating film 18 so as to cover an exposed surface of the first insulating film 18, the first source electrode 23 and the first drain electrode 24.

A first interlayer insulating film 28 is formed on the second insulating film 19 (insulating film 17). In the second insulating film 19 and the first interlayer insulating film 28, there are formed a first source via-hole 29 which penetrates through the films and also exposes a part of the first source electrode 23 and a first drain via-hole 30 which penetrates through the films and also exposes a part of the first drain electrode 24.

A first source wiring 32 is formed on the first interlayer insulating film 28 so as to cover the first source via-hole 29. The first source wiring 32 is embedded also into the first source via-hole 29 and connected to the first source electrode 23 inside the first source via-hole 29.

A first drain wiring 33 is also formed on the first interlayer insulating film 28 so as to cover the first drain via-hole 30.

The first drain wiring 33 is embedded also into the first drain via-hole 30 and connected to the first drain electrode 24 inside the first drain via-hole 30.

A second interlayer insulating film 34 is formed on the first interlayer insulating film 28 so as to cover the first source wiring 32 and the first drain wiring 33. In the insulating film 17, the first interlayer insulating film 28 and the second interlayer insulating film 34, there is formed a gate via-hole 35 which penetrates through the films and exposes a part of the first gate electrode 16. The gate via-hole 35 is formed in a region where no first source electrode 23 is formed on the front surface of the first insulating film 18 (a region on one end side of the gate portion 14).

A gate wiring 36 is formed on the second interlayer insulating film 34 so as to cover the gate via-hole 35. The gate wiring 36 is embedded also into the gate via-hole 35 and connected to the first gate electrode 16 inside the gate via-hole 35.

The second transistor 4 is formed in the second region 12. The first nitride semiconductor layer 7 within the second region 12 constitutes an electron transit layer (second electron transit layer 7B) of the second transistor 4, and the second nitride semiconductor layer 8 within the second region 12 constitutes an electron supply layer (second electron supply layer 8B) of the second transistor 4.

In the second region 12, on the second nitride semiconductor layer 8 (second electron supply layer 8B), there is formed the insulating film 17 which covers an exposed surface of the second electron supply layer 8B and inner surfaces (side surfaces and a bottom surface) of the separation groove 13, etc. The insulating film 17 is constituted of a first insulating film 18 on a lower layer side which leads to the first insulating film 18 of the first region 11 inside the separation groove 13 and a second insulating film 19 on an upper layer side which is formed on the first insulating film 18 and leads to the second insulating film 19 of the first region 11 inside the separation groove 13. Therefore, the inner surfaces of the separation groove 13 as a whole are covered by the insulating film 17.

In the second region 12, a second drain contact hole 41 is formed in the first insulating film 18. A second source contact hole 42 is also formed at a position between the second drain contact hole 41 and the separation groove 13 in the first insulating film 18.

A second drain electrode 43 is formed on the first insulating film 18 so as to cover the second drain contact hole 41. The second drain electrode 43 penetrates through the second drain contact hole 41 to make ohmic contact with the second electron supply layer 8B. The second drain electrode 43 is a drain electrode of the second transistor 4.

Further, a second source electrode 44 is formed on the first insulating film 18 so as to cover the second source contact hole 42. The second source electrode 44 penetrates through the second source contact hole 42 to make ohmic contact with the second electron supply layer 8B. The second source electrode 44 is a source electrode of the second transistor 4.

The second insulating film 19 is formed on the first insulating film 18 so as to cover an exposed surface of the first insulating film 18, the second drain electrode 43 and the second source electrode 44.

In the second region 12, a first interlayer insulating film 28 is formed on the second insulating film 19 (insulating film 17). The first interlayer insulating film 28 of the second region 12 leads to the first interlayer insulating film 28 of the first region 11. In the second insulating film 19 and the first interlayer insulating film 28, there are formed a second drain via-hole 45 which penetrates through the films and also exposes a part of the second drain electrode 43 and a second source via-hole 46 which penetrates the films and also exposes a part of the second source electrode 44.

Further, in the second insulating film 19 and the first interlayer insulating film 28, there is formed a gate opening 47 which penetrates through the films and also exposes a part of the first insulating film 18 at a position between the second drain via-hole 45 and the second source via-hole 46. The gate opening 47 is constituted of a first opening 48 which penetrates through the second insulating film 19 and a second opening 49 which communicates with the first opening 48 and penetrates through the first interlayer insulating film 28. A width of the second opening 49 is larger than that of the first opening 48, and the first opening 48 is opened at a widthwise intermediate portion of a bottom surface of the second opening 49.

A second gate electrode 51 is embedded into the gate opening 47. The second gate electrode 51 is a gate electrode of the second transistor 4. The second gate electrode 51 is constituted of a first electrode portion 52 embedded into the first opening 48 and a second electrode portion 53 embedded into the second opening 49. A lower end portion of the second electrode portion 53 is provided with a field plate portion 53*a* which extends to the second drain electrode 43 side and the second source electrode 44 side with respect to the first electrode portion 52. The field plate portion 53*a* is formed on the second insulating film 19 at a peripheral edge of the first opening 48. The field plate portion 53*a* is formed in order to reduce an electric field concentration between the second drain electrode 43 and the second source electrode 44.

In the second region 12, a second drain wiring 54 is formed on the first interlayer insulating film 28 so as to cover the second drain via-hole 45. The second drain wiring 54 is embedded also into the second drain via-hole 45 and connected to the second drain electrode 43 inside the second drain via-hole 45.

Further, a second source-gate wiring 55 is formed on the first interlayer insulating film 28 so as to cover the gate electrode 51 (gate opening 47) and the second source via-hole 46. The second source-gate wiring 55 is embedded also into the second source via-hole 46 and connected to the second source electrode 44 inside the second source via-hole 46. Further, the second source-gate wiring 55 is also connected to the second gate electrode 51.

In the second region 12, a second interlayer insulating film 34 is formed on the first interlayer insulating film 28 so as to cover the second drain wiring 54 and the second source-gate wiring 55. The second interlayer insulating film 34 of the second region 12 leads to the second interlayer insulating film 34 of the first region 11. In the second interlayer insulating film 34, there is formed a source-gate via-hole 56 which penetrates through the second interlayer insulating film 34 and exposes a part of the second source-gate wiring 55.

In the second region 12, a gate wiring 36 which leads to the gate wiring 36 of the first region 11 is formed on the second interlayer insulating film 34. The gate wiring 36 is embedded also into the source-gate via-hole 56 and connected to the second source-gate wiring 55 inside the source-gate via-hole 56.

A more specific description will be given of the material and others of each portion.

The substrate 2 may be, for example, a low resistance silicon substrate. The low resistance silicon substrate may be a p type substrate having an electrical resistivity of, for example, 0.001 Ωmm to 0.5 Ωmm (more specifically, approximately 0.01 Ωmm to 0.1 Ωmm). Further, besides the low resistance silicon substrate, the substrate 2 may be a low resistance SiC substrate, a low resistance GaN substrate or others. The substrate 2 has a thickness of, for example, approximately 650 µm during a semiconductor process, and is ground to a thickness of approximately not more than 300 µm at a stage before being made into a chip.

In the preferred embodiment, the buffer layer 6 is constituted of a multi-layered buffer layer in which a plurality of nitride semiconductor films are laminated. In the preferred embodiment, the buffer layer 6 is constituted of a first buffer layer (not shown) constituted of an AlN film which is in contact with the front surface of the substrate 2 and a second buffer layer (not shown) constituted of an AlN/AlGaN super lattice layer laminated on a front surface of the first buffer layer (a front surface on the side opposite the substrate 2). The first buffer layer has a film thickness of approximately 100 nm to 500 nm, and the second buffer layer has a film thickness of approximately 500 nm to 2 µm. The buffer layer 6 may be constituted of a single film or a composite film of AlGaN, for example.

In the preferred embodiment, the first nitride semiconductor layer 7 is constituted of a GaN layer and has a thickness of approximately 0.5 µm to 2 µm. In order to suppress a leak current which flows in the first nitride semiconductor layer 7, there may be introduced an impurity for making a region other than a surface region semi-insulating. In this case, the impurity is preferably not less than $4 \times 10^{16}$ cm$^{-3}$ in concentration. Further, the impurity is, for example, C or Fe.

The second nitride semiconductor layer 8 is constituted of a nitride semiconductor having a larger band gap than the first nitride semiconductor layer 7. Specifically, the second nitride semiconductor layer 8 is constituted of a nitride semiconductor with a higher Al composition than the first nitride semiconductor layer 7. In a nitride semiconductor, the higher the Al composition, the larger the band gap. In the preferred embodiment, the second nitride semiconductor layer 8 is constituted of an $Al_{x1}Ga_{1-x1}N$ layer (0<x1<1) and has a thickness of approximately 5 nm to 15 nm.

The first nitride semiconductor layer 7 (electron transit layer) and the second nitride semiconductor layer 8 (electron supply layer) are, thus, constituted of nitride semiconductors that differ in band gap (Al composition), and a lattice mismatch occurs therebetween. Due to spontaneous polarizations of the first nitride semiconductor layer 7 and the second nitride semiconductor layer 8 and also due to a piezopolarization resulting from the lattice mismatch between them, an energy level of a conduction band of the first nitride semiconductor layer 7 at an interface between the first nitride semiconductor layer 7 and the second nitride semiconductor layer 8 is made lower than a Fermi level.

Thereby, a two-dimensional electron gas (2DEG) 9 is spread at a position close to the interface between the first nitride semiconductor layer 7 and the second nitride semiconductor layer 8 (for example, at a distance on the order of several Å from the interface) inside the first nitride semiconductor layer 7 in each of the first region 11 and the second region 12. Since the separation groove 13 is formed at a boundary between the first region 11 and the second region 12, a two-dimensional electron gas generated at both regions 11, 12 is divided by the boundary.

The nitride semiconductor gate layer 15 of the first transistor 3 is constituted of a nitride semiconductor doped with an acceptor type impurity. In the preferred embodiment, the nitride semiconductor gate layer 15 is constituted of a GaN layer (p type GaN layer) doped with the acceptor type impurity and has a thickness of approximately 40 nm to 100 nm.

The concentration of the acceptor type impurity implanted in the nitride semiconductor gate layer 15 is preferably not less than $1×10^{19}$ cm$^{-3}$. In the preferred embodiment, the acceptor type impurity is Mg (magnesium). The acceptor type impurity may instead be Zn (zinc) or other acceptor type impurities other than Mg. The nitride semiconductor gate layer 15 is disposed in a region directly below the gate portion 14 in the first region 11 to cancel out the two-dimensional electron gas 9 generated near the interface between the first nitride semiconductor layer 7 (electron transit layer) and the second nitride semiconductor layer 8 (electron supply layer).

In the preferred embodiment, the gate electrode 16 of the first transistor 3 is constituted of TiN, and the gate electrode 16 has a film thickness of approximately 50 nm to 160 nm.

In the preferred embodiment, the first insulating film 18 is constituted of an SiN film and has a film thickness of approximately 50 nm to 200 nm. In the preferred embodiment, the second insulating film 19 is constituted of an SiN film and has a film thickness of approximately 20 nm to 40 nm (for example, 30 nm). The first insulating film 18 or the second insulating film 19 may be constituted of SiN, $SiO_2$, SiON or a composite film thereof.

The source electrode 23 and the drain electrode 24 of the first transistor 3 as well as the source electrode 44 and the drain electrode 43 of the second transistor 4 are constituted, for example, of a first metal layer (ohmic met layer) in contact with the second nitride semiconductor layer 8, a second metal layer (main electrode metal layer) laminated on the first metal layer, a third metal layer (adhesion layer) laminated on the second metal layer and a fourth metal layer (barrier metal layer) laminated on the third metal layer. The first metal layer is, for example, a Ti layer with a thickness of approximately 10 nm to 20 nm. The second metal layer is, for example, an Al layer with a thickness of approximately 100 nm to 300 nm. The third metal layer is, for example, a Ti layer with a thickness of approximately 10 nm to 20 nm. The fourth metal layer is, for example, a TiN layer with a thickness of approximately 10 nm to 50 nm.

In the preferred embodiment, the first interlayer insulating film 28 is constituted of $SiO_2$ and has a film thickness of approximately 0.5 μm to 1.5 μm. In the preferred embodiment, the second interlayer insulating film 34 is constituted of $SiO_2$ and has a film thickness of approximately 0.5 μm to 1.5 μm.

The source wiring 32 and the drain wiring 33 of the first region 11, the drain wiring 54 and the source-gate wiring 55 of the second region 12, the gate electrode 51 of the second transistor 4 as well as the gate wiring 36 of the first region 11 and that of the second region are constituted, for example, of Al.

With the nitride semiconductor device 1, in each of the first region 11 and the second region 12, the second nitride semiconductor layer 8 (first and second electron supply layers 8A, 8B) differing in band gap (Al composition) is formed on the first nitride semiconductor layer 7 (first and second electron transit layers 7A, 7B), thereby forming a heterojunction. The two-dimensional electron gas 9 is thereby generated inside the first nitride semiconductor layer 7 near the interface between the first nitride semiconductor layer 7 and the second nitride semiconductor layer 8 in each of the first region 11 and the second region 12. Thereby, in each of the first region 11 and the second region 12, there are formed the first transistor 3 and the second transistor 4 constituted of an HEMT which makes use of the two-dimensional electron gas 9 as a channel.

The first gate electrode 16 faces the second nitride semiconductor layer 8 across the nitride semiconductor gate layer 15. Below the first gate electrode 16, energy levels of the first nitride semiconductor layer 7 and the second nitride semiconductor layer 8 are raised by ionized acceptors contained in the nitride semiconductor gate layer 15 constituted of the p type GaN layer. The energy level of the conduction band at the heterojunction interface between the first nitride semiconductor layer 7 and the second nitride semiconductor layer 8 is, thus, made higher than the Fermi level. Therefore, the two-dimensional electron gas 9 due to spontaneous polarizations of the first nitride semiconductor layer 7 and the second nitride semiconductor layer 8 and also due to piezopolarization resulting from the lattice mismatch of the two layers is not formed directly below the first gate electrode 16 (gate portion 14).

Therefore, when a bias is not applied to the first gate electrode 16 (zero-bias state) in the first region 11, the channel due to the two-dimensional electron gas 9 is cut off directly below the first gate electrode 16. As a result, the first transistor 3 formed in the first region 11 is made into a normally-off type transistor.

When an appropriate on voltage (for example, 3V) is applied to the first gate electrode 16, a channel is induced inside the first nitride semiconductor layer 7 directly below the first gate electrode 16, and the two-dimensional electron gas 9 at both sides of the first gate electrode 16 is connected. Thereby, the source and the drain of the first transistor 3 are made continuous to each other.

On the other hand, the second gate electrode 51 faces the second nitride semiconductor layer 8 across the insulating film 17, and no nitride semiconductor gate layer is interposed between the second gate electrode 51 and the second nitride semiconductor layer 8. Therefore, when a bias is not applied to the second gate electrode 51 (zero-bias state), the source and the drain of the second transistor 4 are made continuous to each other and the second transistor 4 is made into a normally-on type transistor.

Figure 2:
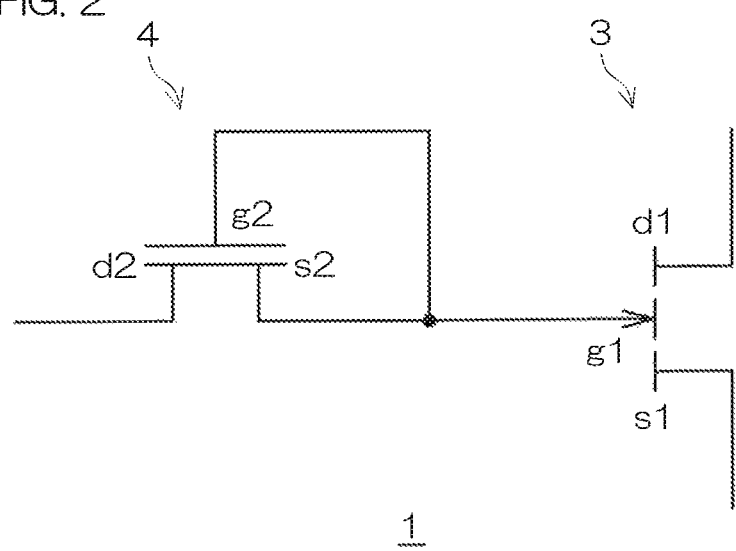
FIG. 2 is an electric circuit diagram which shows an electric structure of the nitride semiconductor device of FIG. 1.

FIG. 2 is an electric circuit diagram which shows an electric structure of the nitride semiconductor device of FIG. 1.

With reference to FIG. 1 and FIG. 2, the second gate electrode g2 (51) and the second source electrode s2 (44) of the second transistor 4 are connected to the first gate electrode g1 (16) of the first transistor 3 via the second source-gate wiring 55 and the gate wiring 36. In the semiconductor device 1, a gate voltage is applied to the first gate electrode g1 (16) of the first transistor 3 via the second transistor 4. It is noted that in FIG. 2, s1 indicates the first source electrode 23 of the first transistor 3 and d1 indicates the drain electrode 24 of the first transistor 3.

For use, for example, a predetermined voltage (for example, of 10 V to 500 V), with which the first drain electrode d1 (24) side becomes positive, is applied across the first source electrode s1 (23) and the first drain electrode d1 (24) of the first transistor 3. In this state, an off voltage (0V) or an on voltage (5V) is applied to the first gate electrode g1 (16) of the first transistor 3 via the second transistor 4, with the first source electrode s1 (23) being set as a reference potential (0V). An external gate voltage is applied to the second drain electrode d2 (43) of the second transistor 4.

FIG. 3A to FIG. 3L are each a sectional view for describing one example of a manufacturing step of the nitride semiconductor device 1 of FIG. 1, showing a sectional structure thereof at a plurality of stages in the manufacturing step.

First, as shown in FIG. 3A, the buffer layer 6, the first nitride semiconductor layer 7 (first and second electron transit layers 7A, 7B) and the second nitride semiconductor layer 8 (first and second electron supply layers 8A, 8B) are epitaxially grown on the substrate 2 by an MOCVD (Metal Organic Chemical Vapor Deposition) method. Further, a gate layer material film 71 which is a material film of the nitride semiconductor gate layer 15 is formed on the second nitride semiconductor layer 8 by the MOCVD method. The gate layer material film 71 is constituted of a p type GaN film. A front surface of second nitride semiconductor layer 8 has the first region 11 and the second region 12.

Next, as shown in FIG. 3B, a gate electrode film 72 which is a material film of the first gate electrode 16 is formed on the gate layer material film 71, for example, by a sputtering method. The gate electrode film 72 is constituted, for example, of a TiN film.

Next, as shown in FIG. 3C, the gate electrode film 72 and the gate layer material film 71 are patterned by photolithography and etching, and the gate portion 14 is formed on the second nitride semiconductor layer 8 in the first region 11. The gate portion 14 is constituted of the nitride semiconductor gate layer 15 and the first gate electrode 16 formed thereon.

Figure 3D:
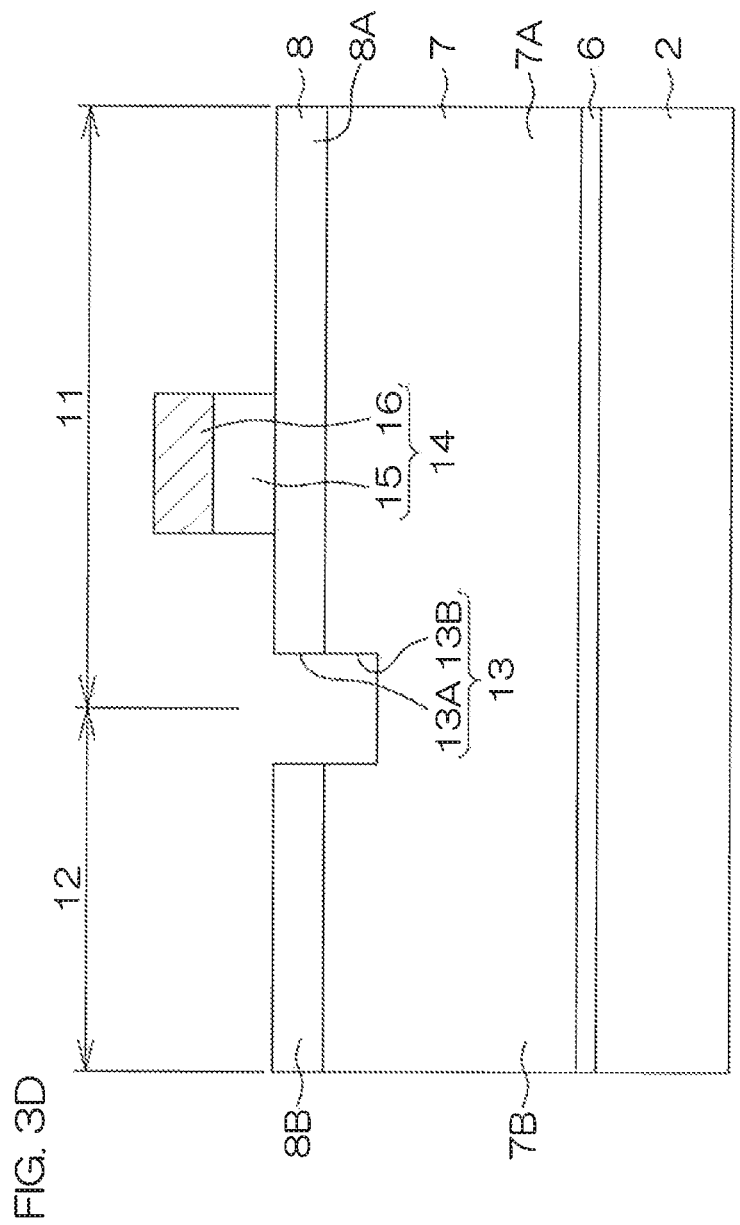
FIG. 3D is a sectional view which shows a step subsequent to that of FIG. 3C.

Next, as shown in FIG. 3D, the separation groove 13 which separates the first region 11 from the second region 12 is formed on the front surface of the second nitride semiconductor layer 8 by photolithography and etching. The separation groove 13 is constituted of a penetration portion 13A which penetrates through the second nitride semiconductor layer 8 and a recessed portion 13B which is formed on a surface layer of the first nitride semiconductor layer 7.

Figure 3E:
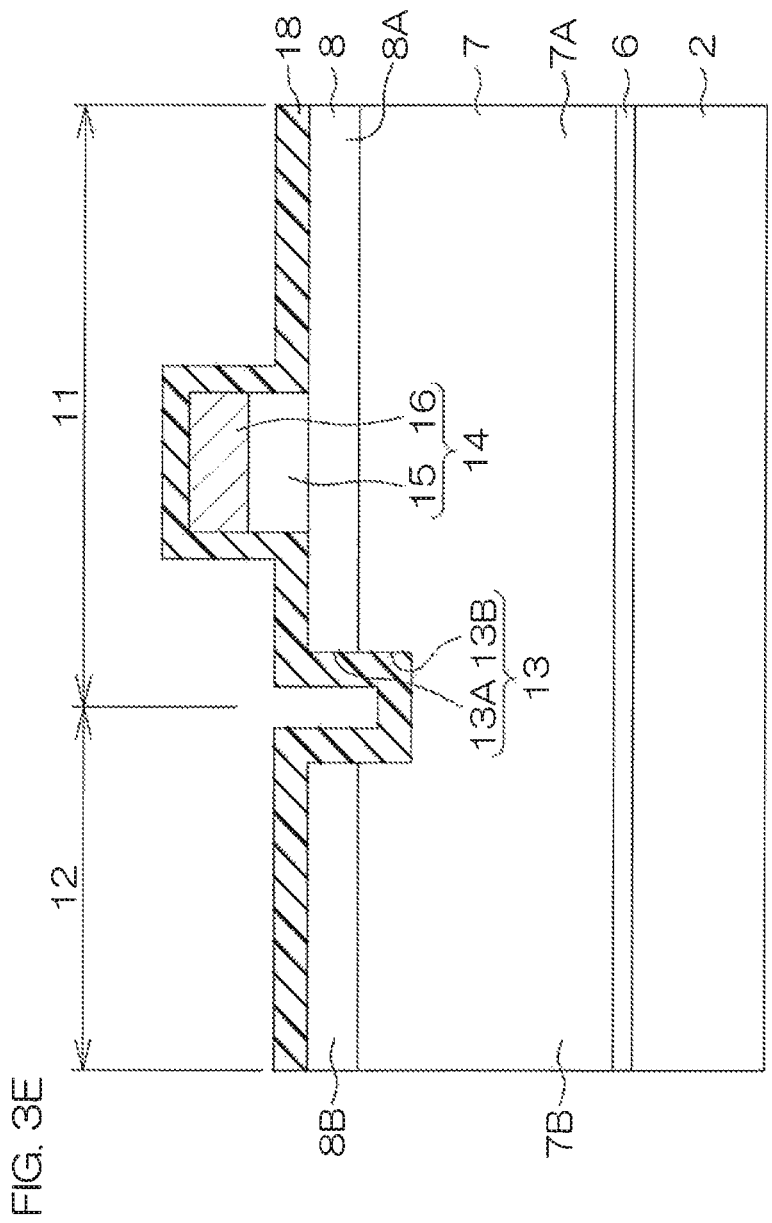
FIG. 3E is a sectional view which shows a step subsequent to that of FIG. 3D.

Next, as shown in FIG. 3E, the first insulating film 18 is formed so as to cover the entirety of an exposed front surface, for example, by an LPCVD (Low Pressure Chemical Vapor Deposition) method. The first insulating film 18 is constituted, for example, of an SiN film.

Figure 3F:
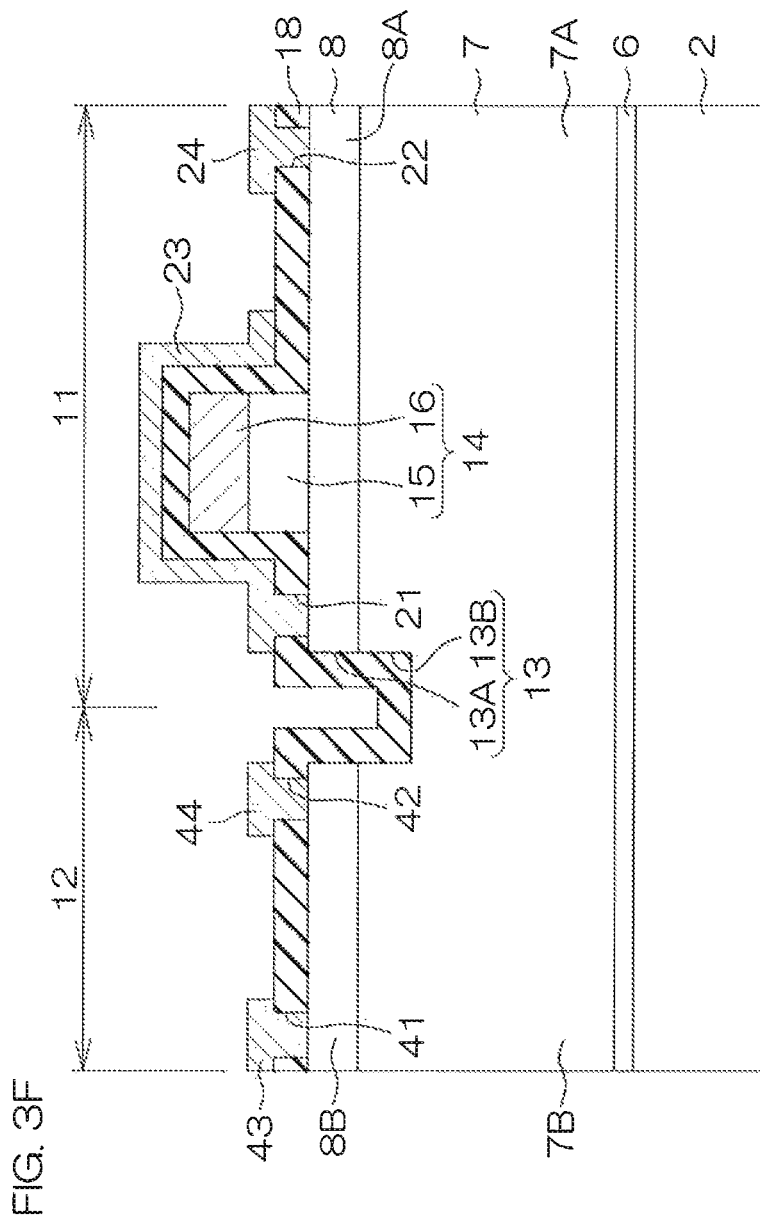
FIG. 3F is a sectional view which shows a step subsequent to that of FIG. 3E.

Next, as shown in FIG. 3F, the first source contact hole 21 and the first drain contact hole 22 are formed in the first insulating film 18 by photolithography and etching in the first region 11. At the same time, in the second region 12, the second drain contact hole 41 and the second source contact hole 42 are also formed in the first insulating film 18.

Thereafter, a source-drain electrode film is formed so as to cover the entirety of an exposed front surface, for example, by a sputtering method. Then, the source-drain electrode film is patterned by photolithography and etching, thereby forming in the first region 11 the first source electrode 23 and the first drain electrode 24 which make ohmic contact with the second nitride semiconductor layer 8. The second drain electrode 43 and the second source electrode 44 which make ohmic contact with the second nitride semiconductor layer 8 are also formed in the second region 12.

These electrodes 23, 24, 43, 44 are constituted, for example, of a Ti layer in contact with the second nitride semiconductor layer 5, an Al layer laminated on the Ti layer, a Ti layer laminated on the Al layer and a TiN layer laminated on the Ti layer.

Figure 3G:
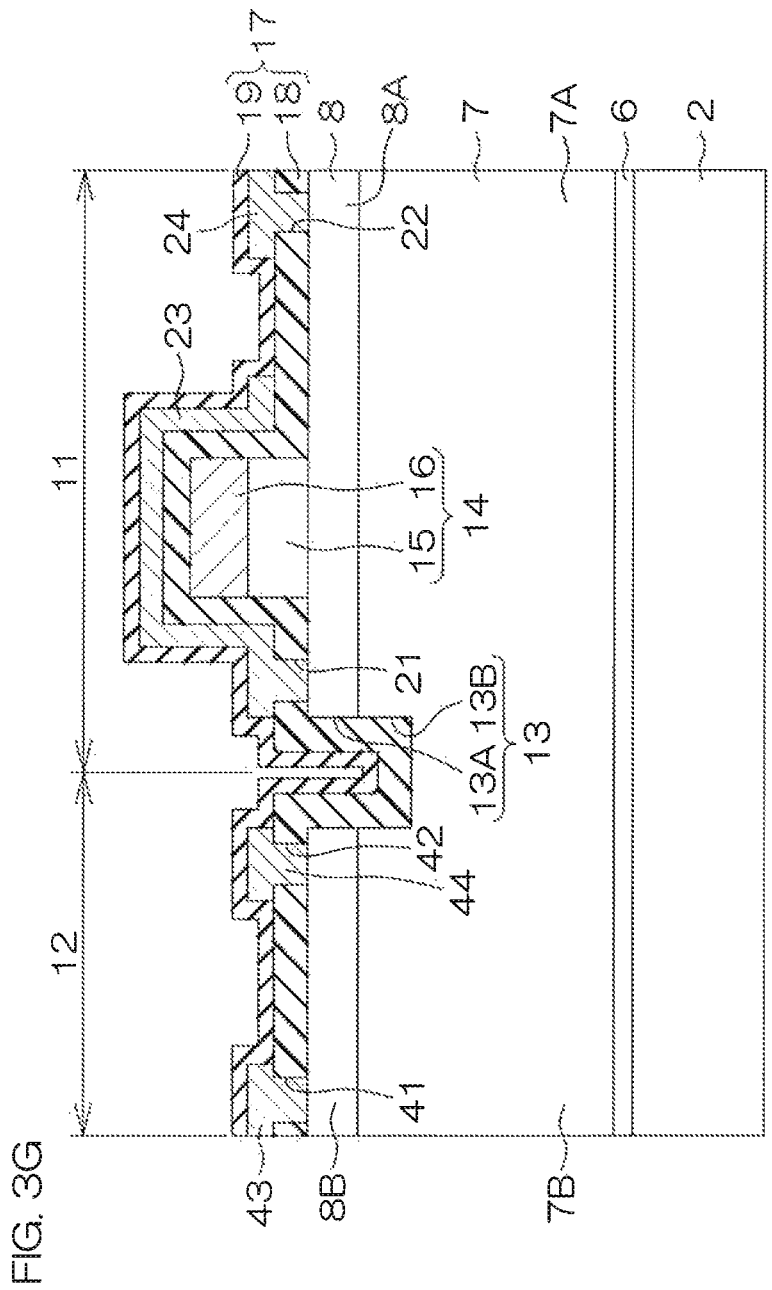
FIG. 3G is a sectional view which shows a step subsequent to that of FIG. 3F.

Next, as shown in FIG. 3G, the second insulating film 19 is formed so as to cover the entirety of an exposed front surface, for example, by the LPCVD method. The second insulating film 19 is constituted, for example, of an SiN film.

The insulating film 17 is formed with the first insulating film 18 and the second insulating film 19.

Figure 3H:
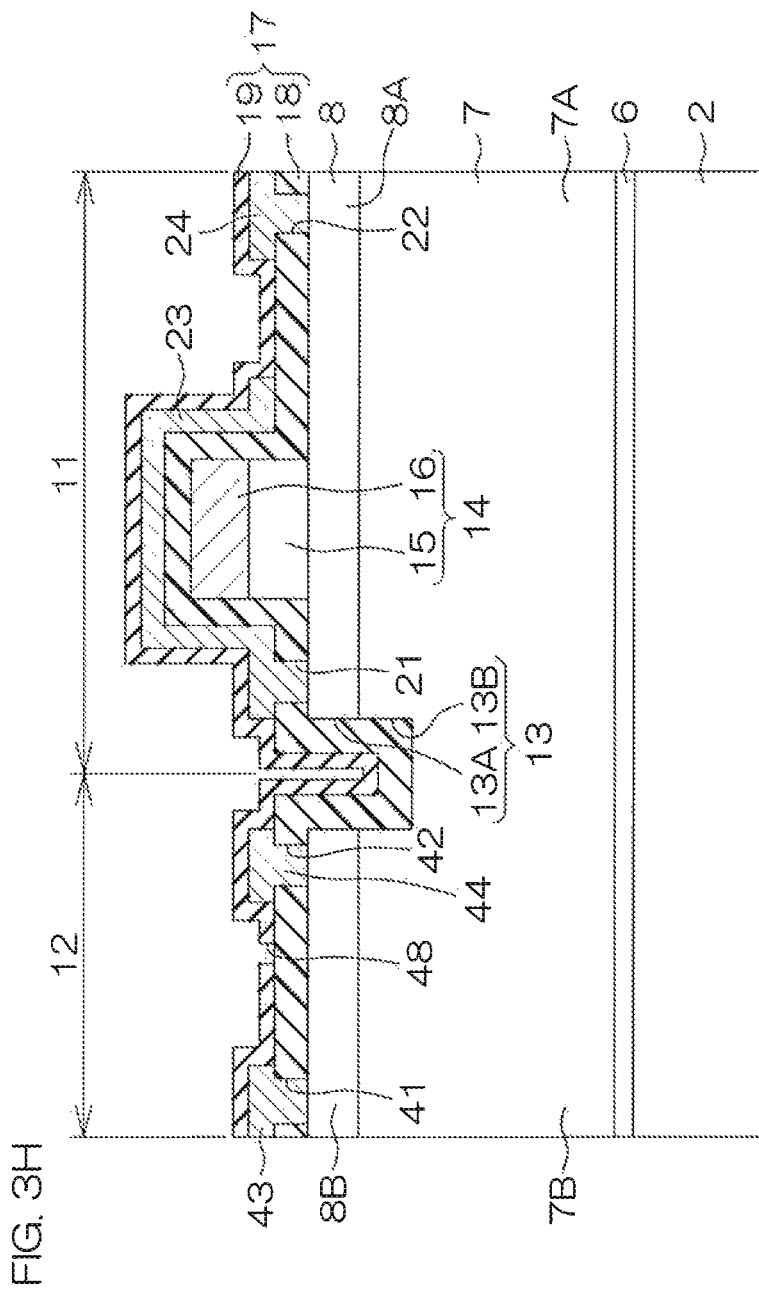
FIG. 3H is a sectional view which shows a step subsequent to that of FIG. 3G.

Next, as shown in FIG. 3H, the first opening 48 is formed in the second insulating film 19 in the second region 12 by photolithography and etching.

Figure 3I:
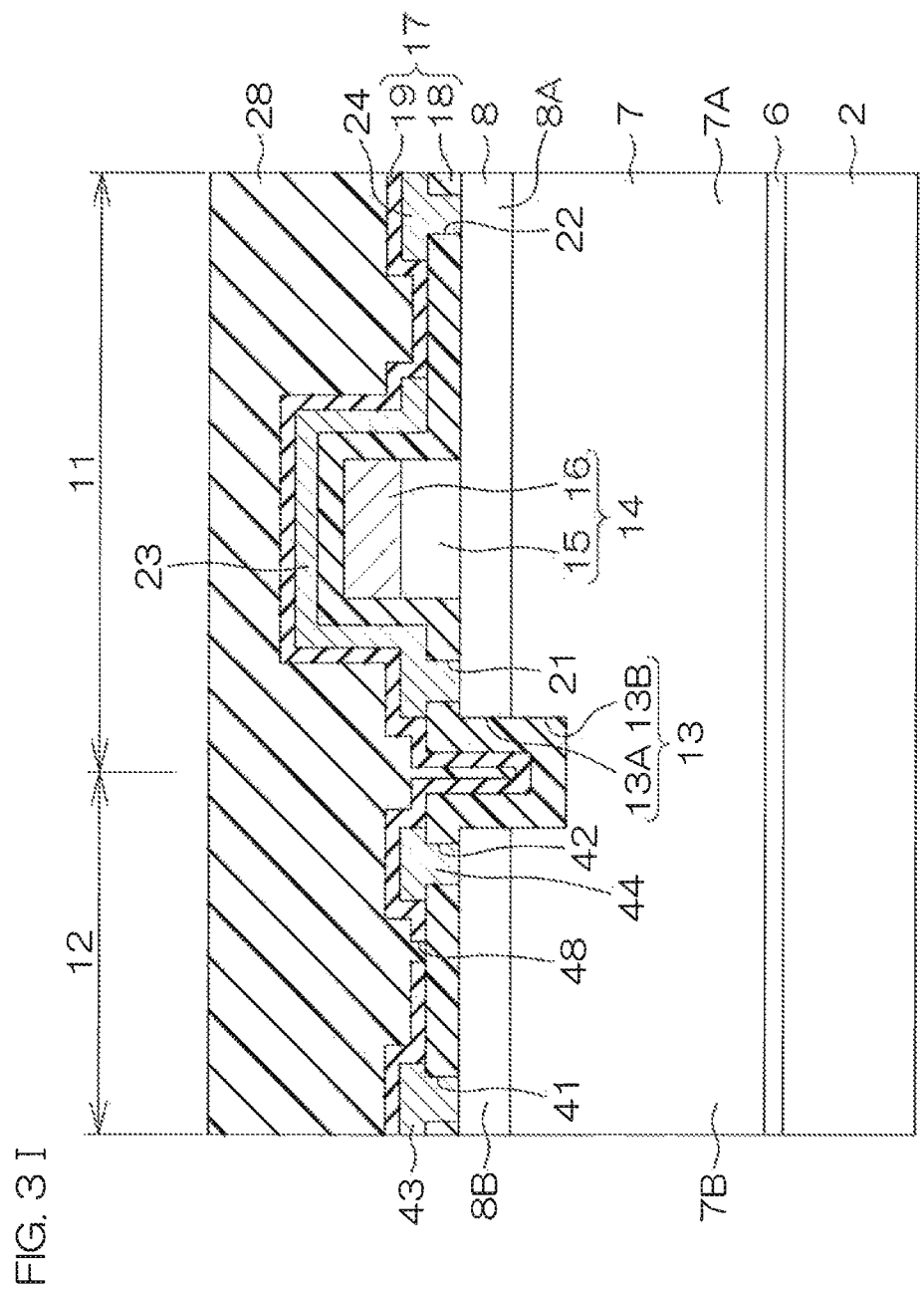
FIG. 3I is a sectional view which shows a step subsequent to that of FIG. 3H.

Next, as shown in FIG. 3I, the first interlayer insulating film 28 is formed so as to cover the entirety of an exposed front surface. The first interlayer insulating film 28 is constituted, for example, of an $SiO_2$ film.

Figure 3J:
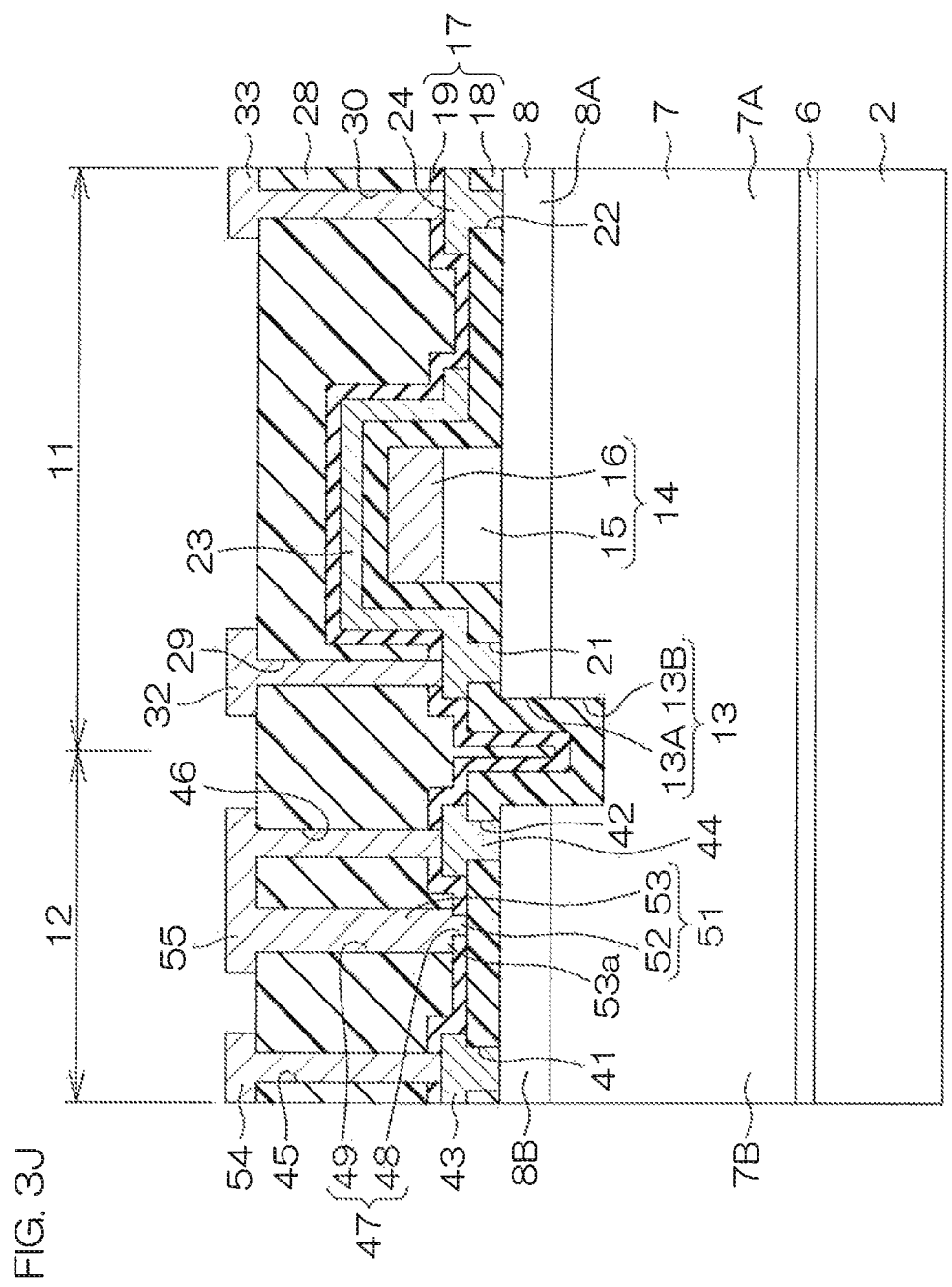
FIG. 3J a sectional view which shows a step subsequent to that of FIG. 3I.

Next, as shown in FIG. 3J, the first source via-hole 29 and the first drain via-hole 30 are formed on a laminated film of the second insulating film 19 and the first interlayer insulating film 28 in the first region 11 by photolithography and etching. Further, the second drain via-hole 45 and the second source via-hole 46 are formed on the laminated film of the second insulating film 19 and the first interlayer insulating film 28 in the second region 12. Further, the second opening 49 which communicates with the first opening 48 is formed in the first interlayer insulating film 28. Thereby, provided is the gate opening 47 which is constituted of the first opening 48 and the second opening 49.

Thereafter, a first wiring film is formed on the first interlayer insulating film 28, for example, by a sputtering method. The first wiring film is thereby embedded into the first and the second source via-holes 29, 46, the first and the second drain via-holes 30, 45 and the gate opening 47, and also the first wiring film is formed on the first interlayer insulating film 28. The first wiring film is constituted, for example, of an Al film.

The second gate electrode 51 which is constituted of the first wiring film embedded into the gate opening 47 is also thereby formed. The second gate electrode 51 is constituted of the first electrode portion 52 inside the first opening 48 and the second electrode portion 53 inside the second opening 49. The second electrode portion 53 has at both sides of the lower end portion thereof the field plate 53a formed on the second insulating film 19 at the peripheral edge of the first opening 48.

Thereafter, the first wiring film on the first interlayer insulating film 28 is patterned by photolithography and etching. Thereby, the first source wiring 32 connected to the first source electrode 23 and the first drain wiring 33 connected to the first drain electrode 24 are formed on the first interlayer insulating film 28 in the first region 11. Further, the second drain wiring 54 connected to the second drain electrode 43 and the second source-gate wiring 55 connected to the second gate electrode 51 and the second source electrode 44 are formed on the first interlayer insulating film 28 in the second region 12.

Figure 3K:
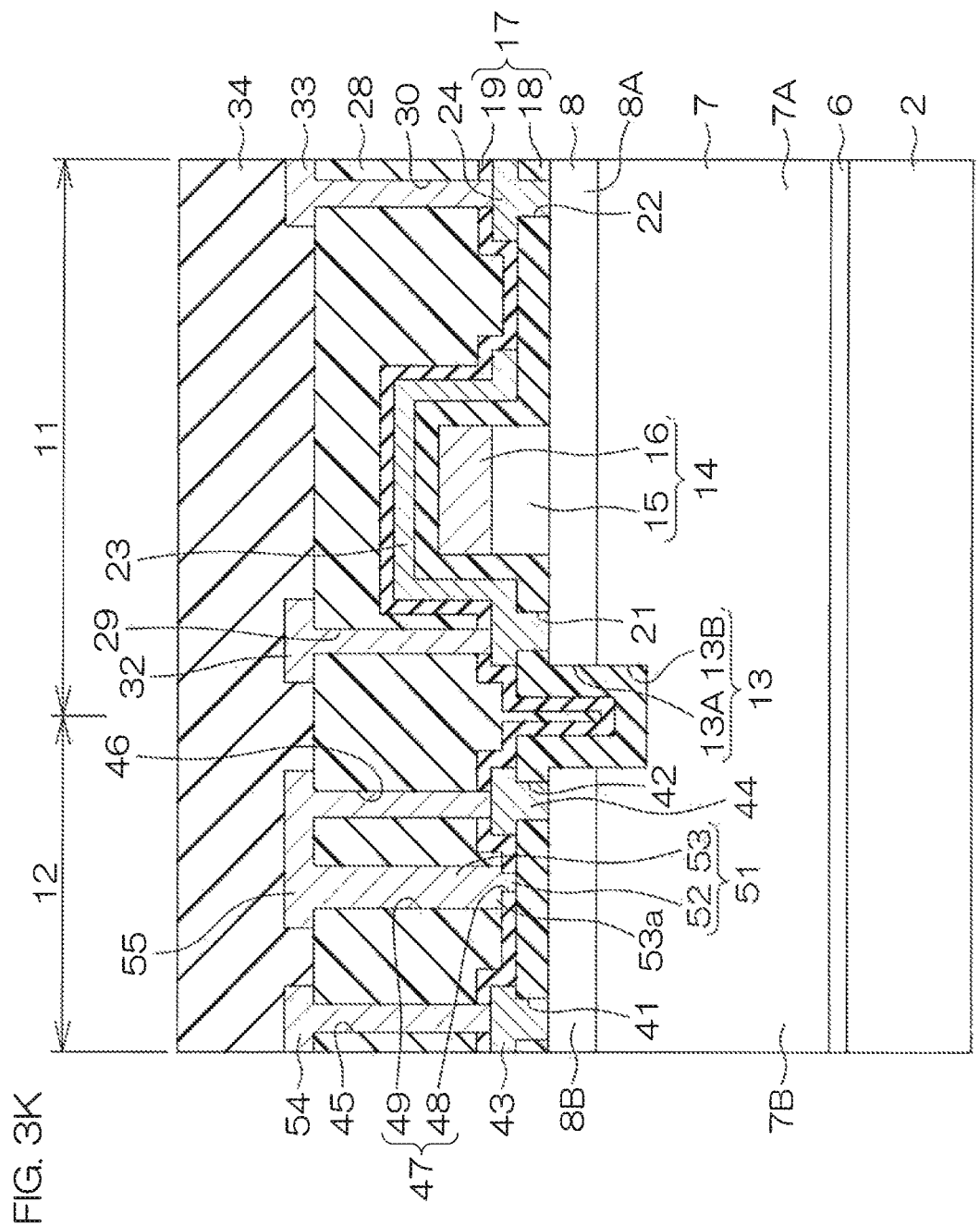
FIG. 3K is a sectional view which shows a step subsequent to that of FIG. 3J.

Next, as shown in FIG. 3K, the second interlayer insulating film 34 is formed on the first interlayer insulating film 28 so as to cover the first source wiring 32, the first drain wiring 33, the second drain wiring 54 and the second source-gate wiring 55. The second interlayer insulating film 34 is constituted, for example, of an $SiO_2$ film.

Figure 3L:
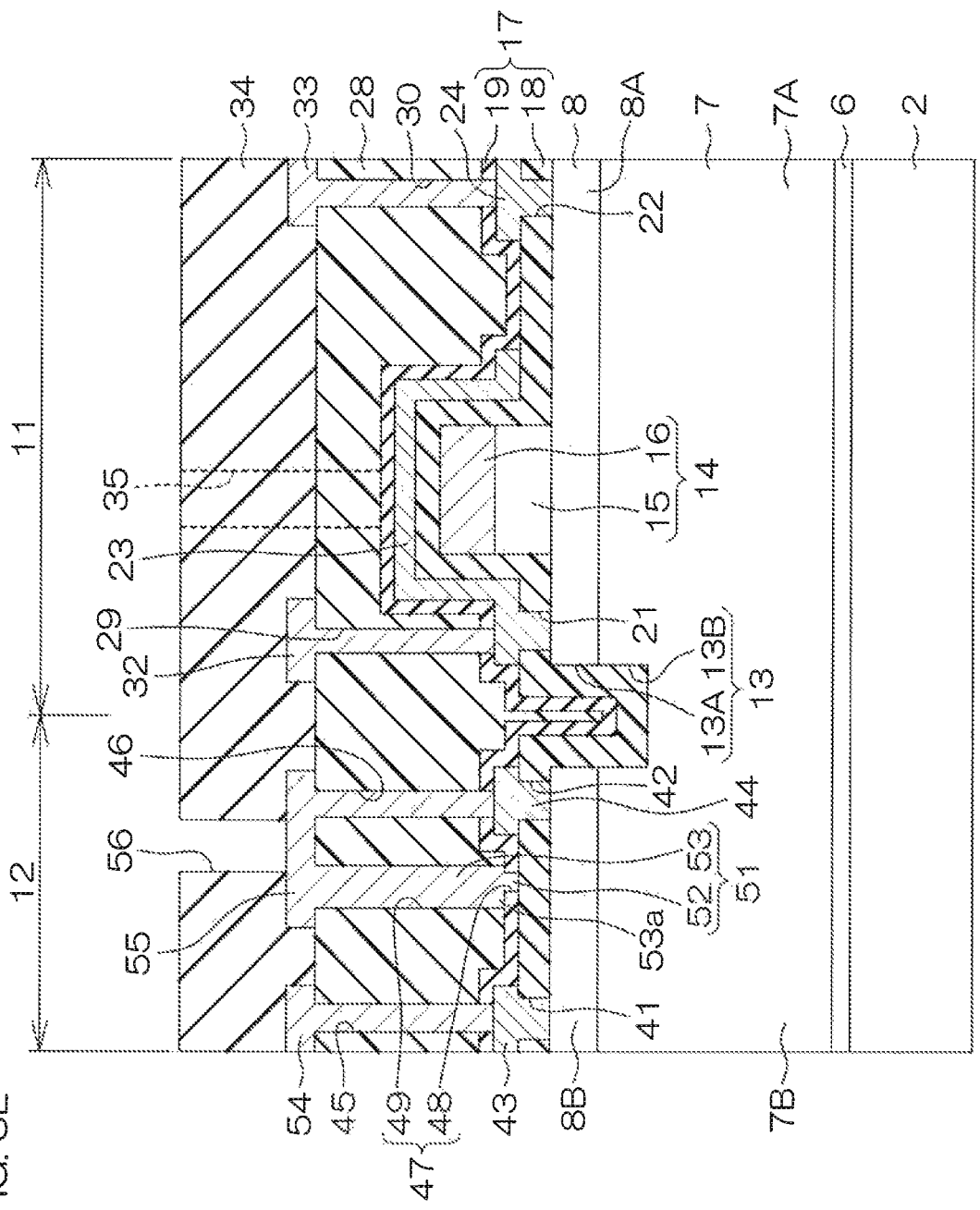
FIG. 3L is a sectional view which shows a step subsequent to that of FIG. 3K.

Next, as shown in FIG. 3L, in the insulating film 17, the first interlayer insulating film 28 and the second interlayer insulating film 34, the gate via-hole 35 which penetrates through the films is formed by photolithography and etching in the first region 11. Further, the source-gate via-hole 56 which reaches the second source gate wiring 55 is formed in the second region 12.

Thereafter, a second wiring film is formed on the second interlayer insulating film 34, for example, by a sputtering method. The second wiring film is thereby embedded into the gate via-hole 35 and the source-gate via-hole 56, and the second wiring film is formed on the second interlayer insulating film 34. The second wiring film is constituted, for example, of an Al film. Then, the second wiring film on the second interlayer insulating film 34 is patterned by photolithography and etching. Thereby, the gate wiring 36 which is connected to the gate electrode 16 of the first transistor 3 and to the source-gate wiring 55 of the second transistor 4 is formed on the second interlayer insulating film 34. Thus, there is provided the nitride semiconductor device 1 having a structure shown in FIG. 1.

Figure 4:
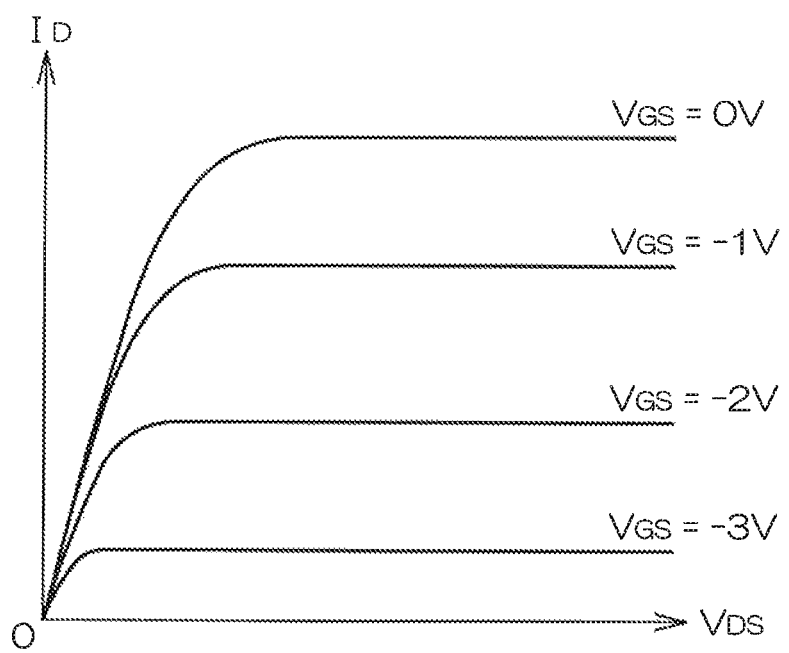
FIG. 4 is a graph which shows characteristics of drain current $I_D$ with respect to a drain-source voltage $I_{DS}$ of a normally-on type HEMT.

FIG. 4 is a graph which shows characteristics of a drain current $I_D$ with respect to a drain-source voltage $V_{DS}$ of a normally-on type HEMT. Each of the curves in FIG. 4 indicates $V_{DS}$-$I_D$ characteristics where the gate-source voltage $V_{GS}$ is 0, −1, −2 and −3V.

As shown in FIG. 4, in the case of the normally-on type HEMT, a saturation region which limits the drain current $I_D$ is present in a high drain-source voltage region at which the drain-source voltage $V_{DS}$ is not less than a predetermined value.

The second transistor 4 is a normally-on type HEMT, and the gate electrode 51 and the source electrode 44 thereof are connected to each other. Thus, the gate-source voltage $V_{GS}$ is zero. Therefore, the second transistor 4 has characteristics similar to $V_{DS}$-$I_D$ characteristics shown by the curve of $V_{GS}$=0 in FIG. 4.

Therefore, even upon occurrence of a high drain-source voltage of the second transistor 4 by parasitic inductance inside the gate control circuit at the time of switching of the first transistor 3, the drain current $I_D$ of the second transistor 4 is limited by the saturation region of $V_{DS}$-$I_D$ characteristics. It is, thereby, possible to suppress an excessively large gate current from flowing in the first gate electrode 16 of the first transistor 3.

Figure 5:
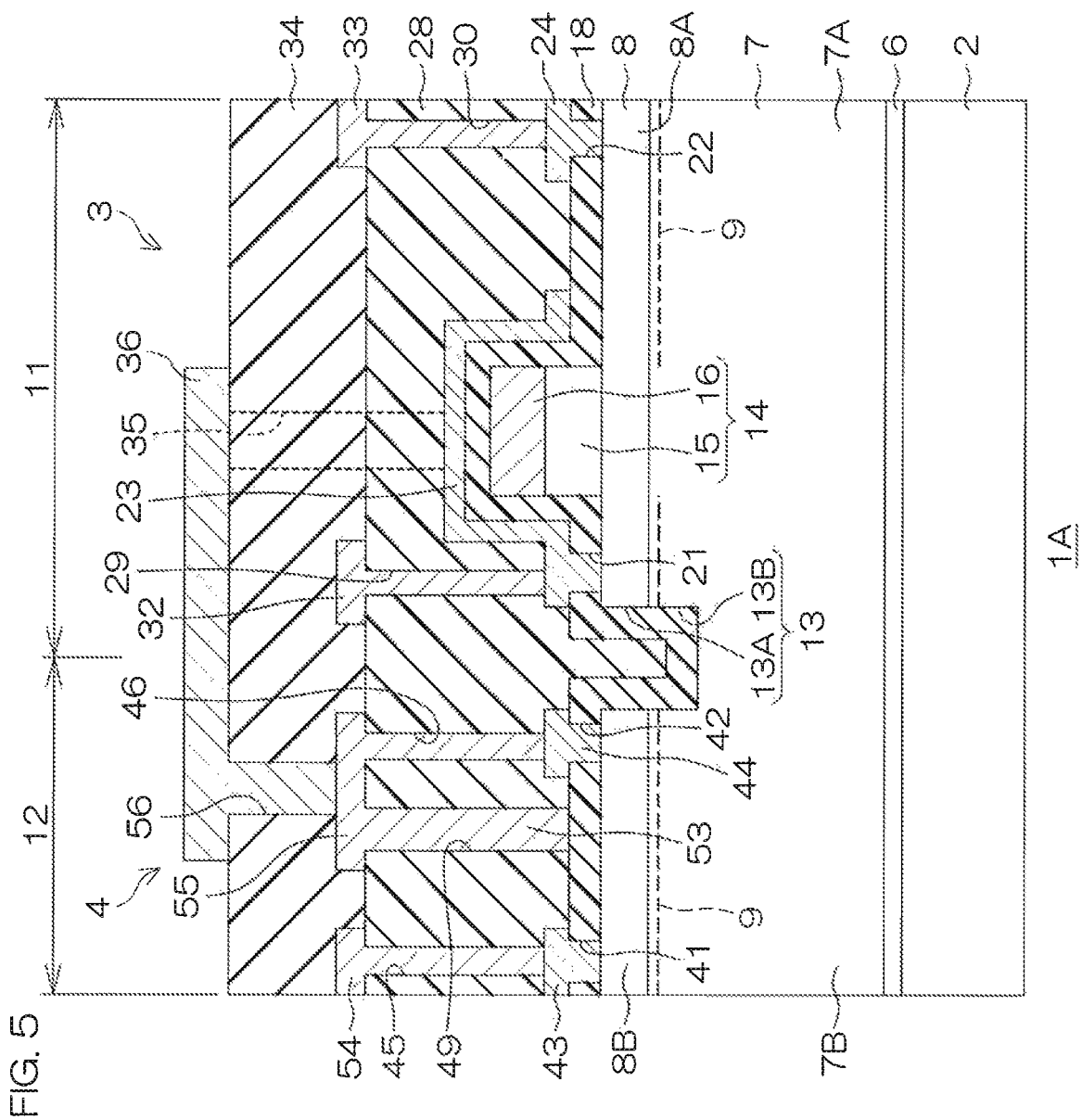
FIG. 5 is a sectional view for describing a constitution of a nitride semiconductor device according to a second preferred embodiment of the present invention.

FIG. 5 is a sectional view for describing a constitution of the nitride semiconductor device according to the second preferred embodiment of the present invention. In FIG. 5, portions corresponding to the individual portions of FIG. 1 described above will be given the same symbols as those of FIG. 1.

As with the nitride semiconductor device 1 of FIG. 1, the nitride semiconductor device 1A of FIG. 5 has a first transistor 3 constituted of a normally-off transistor and a second transistor 4 constituted of a normally-on transistor and connected to a gate of the first transistor 3. In the second preferred embodiment as well, the first transistor 3 and the second transistor 4 are formed on the same substrate 2. The first transistor 3 functions as a main transistor. The second transistor 4 functions as a current limiting element for limiting a gate current of the first transistor 3.

The semiconductor device 1A of FIG. 5 is different from the semiconductor device 1 of FIG. 1 only in that the second insulating film 19 of FIG. 1 is not formed. That is, in the semiconductor device 1A of FIG. 5, an insulating film corresponding to the insulating film 17 of FIG. 1 is constituted only of the first insulating film 18 of FIG. 1. Thus, in FIG. 5, the insulating film corresponding to the insulating film 17 of FIG. 1 is indicated by symbol 18.

In the semiconductor device 1A of FIG. 5, a first interlayer insulating film 28 is formed on the insulating film 18 so as to cover an exposed surface of the insulating film 18, a first and a second source electrodes 23, 44 as well as a first and a second drain electrodes 24, 43. A first source via-hole 29, a first drain via-hole 30, a second drain via-hole 45 and a second source via-hole 46 each penetrate through the first interlayer insulating film 28 to reach the first source electrode 23, the first drain electrode 24, the second drain electrode 43 and the second source electrode 44.

Since the second insulating film 19 of FIG. 1 is not formed in the semiconductor device 1A of FIG. 5, a gate opening corresponding to the gate opening 47 of FIG. 1 is constituted only of the second opening 49 of FIG. 1. Therefore, in FIG. 5, the gate opening corresponding to the gate opening 47 of FIG. 1 is indicated by symbol 49.

Further, in the semiconductor device 1A of FIG. 5, a gate via-hole 35 penetrates through a laminated film of the insulating film 18, the first interlayer insulating film 28 and a second interlayer insulating 34 to reach a first gate electrode 16.

FIG. 6A to FIG. 6D are each a sectional view for describing one example of a manufacturing step of the nitride semiconductor device 1A of FIG. 5, showing a sectional structure thereof at a plurality of stages in the manufacturing step.

The steps of the first preferred embodiment in FIG. 3A to FIG. 3F described above are steps also common to manufacturing of the second preferred embodiment, and therefore, description thereof is omitted here. However, in the second preferred embodiment, the first insulating film 18″ described in FIG. 3A to FIG. 3F shall be read as "the insulating film 18" of the second preferred embodiment.

When the first source electrode 23, the first drain electrode 24, the second drain electrode 43 and the second source electrode 44 are formed by the step of FIG. 3F, as shown in FIG. 6A, the first interlayer insulating film 28 is formed so as to cover the entirety of an exposed front surface. The first interlayer insulating film 28 is constituted, for example, of an SiO$_2$ film.

Figure 6B:
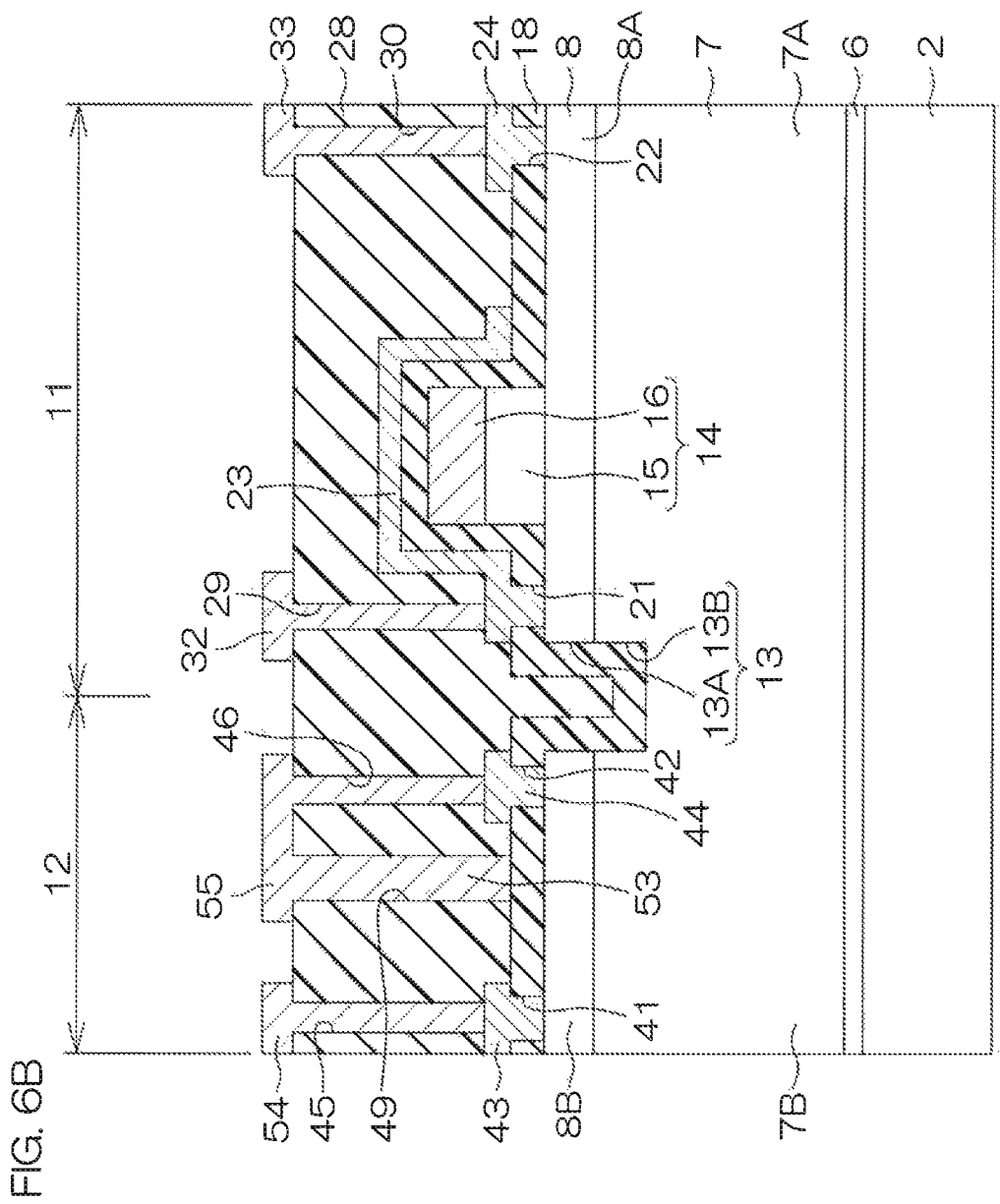
FIG. 6B is a sectional view which shows a step subsequent to that of FIG. 6A.

Next, as shown in FIG. 6B, the first source via-hole 29 and the first drain via-hole 30 are formed in a laminated film of the insulating film 18 and the first interlayer insulating film 28 by photolithography and etching in a first region 11. Further, the second drain via-hole 45, the second source via-hole 46 and the gate opening 49 are formed in the laminated film of the insulating film 18 and the first interlayer insulating film 28 also in a second region 12.

Thereafter, a first wiring film is formed on the first interlayer insulating film 28, for example, by a sputtering method. The first wiring film is thereby embedded into the first and the second source via-holes 29, 46, the first and the second drain via-holes 30, 45 as well as the gate opening 49, and the first wiring film is also formed on the first interlayer insulating film 28. The first wiring film is constituted, for example, of an Al film. Thereby a second gate electrode 51 is formed which is constituted of the first wiring film embedded into the gate opening 49.

Thereafter, the first wiring film on the first interlayer insulating film 28 is patterned by photolithography and etching. Thereby, a first source wiring 32 connected to the first source electrode 23 and a first drain wiring 33 connected to the first drain electrode 24 are formed on the first interlayer insulating film 28 in the first region 11. Also, in the second region 12, a second drain wiring 54 connected to the second drain electrode 43 and a second source-gate wiring 55 connected to the second gate electrode 51 and the second source electrode 44 are formed on the first interlayer insulating film 28.

Figure 6C:
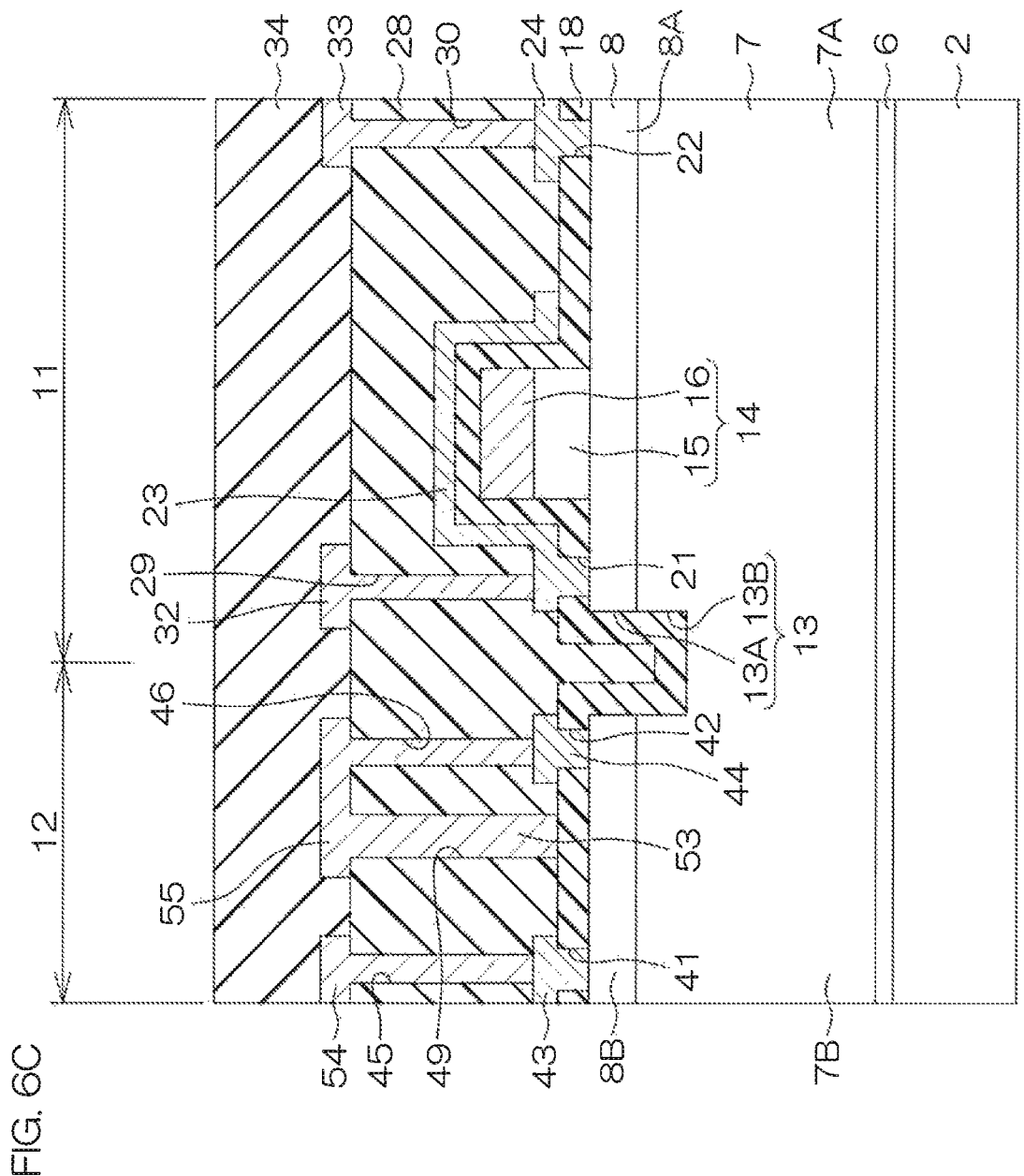
FIG. 6C is a sectional view which shows a step subsequent to that of FIG. 6B.

Next, as shown in FIG. 6C, the second interlayer insulating film 34 is formed on the first interlayer insulating film 28 so as to cover the first source wiring 32, the first drain wiring 33, the second drain wiring 54 and the second source-gate wiring 55. The second interlayer insulating film 34 is constituted, for example, of an SiO$_2$ film.

Figure 6D:
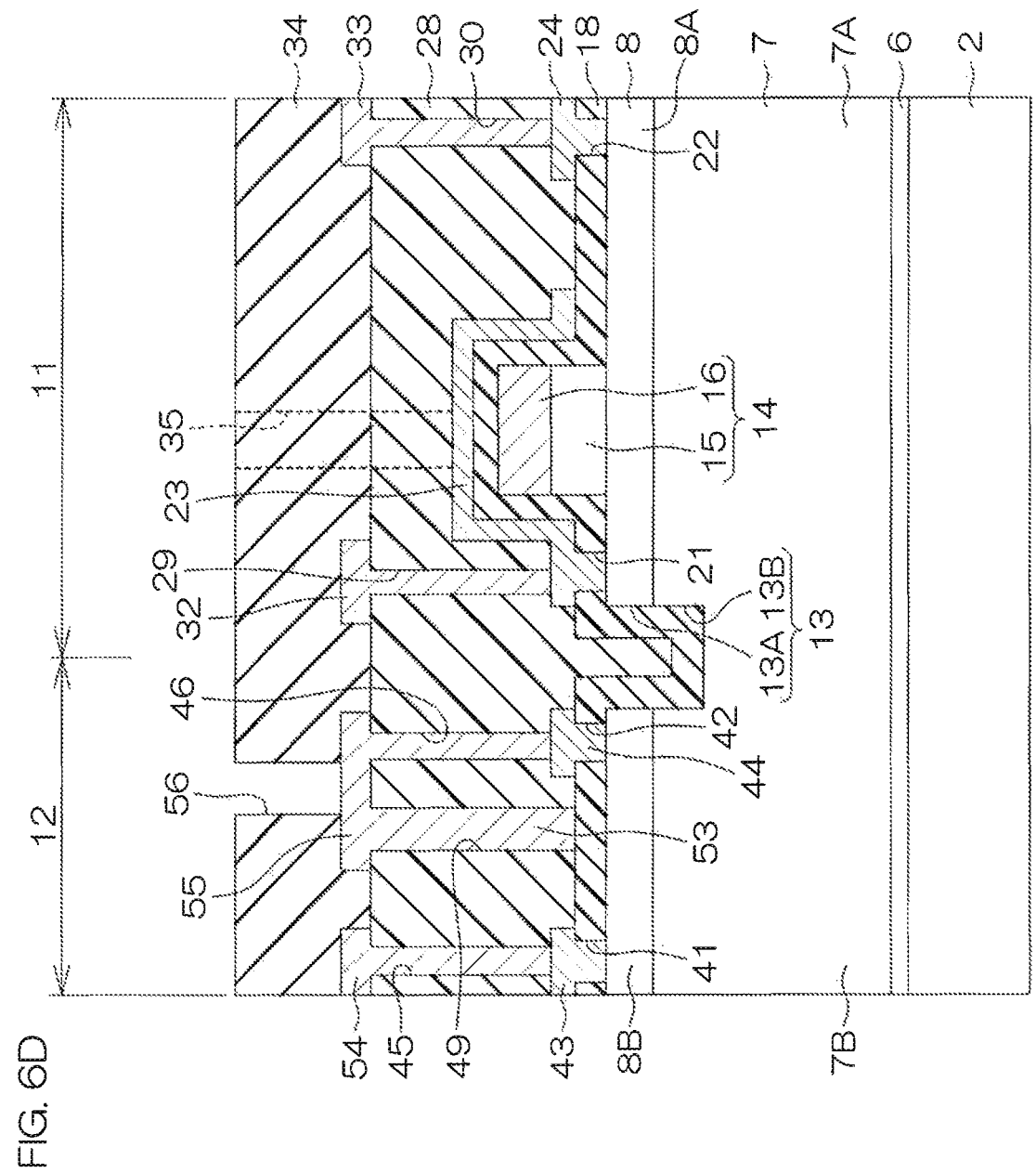
FIG. 6D is a sectional view which shows a step subsequent to that of FIG. 6C.

Next, as shown in FIG. 6D, in the insulating film 18, the first interlayer insulating film 28 and the second interlayer insulating film 34, the gate via-hole 35 which penetrates through the films is formed by photolithography and etching in the first region 11. A source-gate via-hole 56 which reaches the second source-gate wiring 55 is formed also in the second region 12.

Thereafter, a second wiring film is formed on the second interlayer insulating film 34, for example, by a sputtering method. The second wiring film is thereby embedded into the gate via-hole 35 and the source-gate via-hole 56, and the second wiring film is also formed on the second interlayer insulating film 34. The second wiring film is constituted, for example, of an Al film. Then, the second wiring film on the second interlayer insulating film 34 is patterned by photolithography and etching. A gate wiring 36 connected to the gate electrode 16 of the first transistor 3 and the source-gate wiring 55 of the second transistor 4 is, thereby, formed on the second interlayer insulating film 34. Thus, there is provided the nitride semiconductor device 1A having a structure shown in FIG. 5.

The nitride semiconductor device 1A of FIG. 5 also provides the effects similar to those of the nitride semiconductor device 1 of FIG. 1.

While preferred embodiments of the present invention have been described above, the present invention may be implemented in yet other embodiments. For example, in the previously described embodiments, the first transistor 3 and the second transistor 4 are formed on the same substrate 2. However, the first transistor 3 and the second transistor 4 may be formed on different substrates. Then, these substrates may be internally housed in one package.

Further, in the previously described preferred embodiments, silicon is shown as an example of the material of the substrate 2. However, any given substrate material can be used, for example, a sapphire substrate and a GaN substrate, besides silicon.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A nitride semiconductor device comprising:
   a first transistor which is constituted of a normally-off transistor and functions as a main transistor; and
   a second transistor which is constituted of a normally-on transistor and arranged to limit a gate current of the first transistor; wherein
   the first transistor includes a first electron transit layer which is constituted of a nitride semiconductor and a first electron supply layer which is formed on the first electron transit layer and constituted of a nitride semiconductor,
   the second transistor includes a second electron transit layer which is constituted of a nitride semiconductor and a second electron supply layer which is formed on the second electron transit layer and constituted of a nitride semiconductor,
   a gate electrode and a source electrode of the second transistor are electrically connected to a gate electrode of the first transistor,
   a first nitride semiconductor layer which constitutes the first electron transit layer and the second electron transit layer is formed on the substrate,
   a second nitride semiconductor layer which constitutes the first electron supply layer and the second electron supply layer is formed on the first nitride semiconductor layer,
   on a front surface of the second nitride semiconductor layer, there is formed a separation groove for separating a first region in which the first transistor is formed from a second region in which the second transistor is formed, and
   the separation groove penetrates through the second nitride semiconductor layer and extends to an interior of the first nitride semiconductor layer.

2. The nitride semiconductor device according to claim 1, wherein the first transistor and the second transistor are formed on the same substrate.

3. The nitride semiconductor device according to claim 2, wherein the first electron transit layer leads to the second electron transit layer on the substrate.

4. The nitride semiconductor device according to claim 1, wherein
   the source electrode of the first transistor has a portion that covers the side surface and the upper surface of the gate electrode of the first transistor.

5. The nitride semiconductor device according to claim 1, wherein
   the first transistor has a nitride semiconductor gate layer which is disposed on the first electron supply layer and also contains an acceptor type impurity, and
   a gate electrode of the first transistor is formed on the nitride semiconductor gate layer.

6. The nitride semiconductor device according to claim 1, wherein
   the second transistor has a gate insulating film which is formed on the second electron supply layer and
   a gate electrode of the second transistor is formed on the gate insulating film.

7. The nitride semiconductor device according to claim 6, wherein
   the gate insulating film has a recessed portion on a front surface thereof on the side opposite the second electron supply layer, and
   the gate electrode of the second transistor has a portion which is embedded into the recessed portion and a field plate portion which is formed on the front surface of the gate insulating film at a peripheral edge of the recessed portion.

8. The nitride semiconductor device according to claim 1, wherein the gate electrode of the second transistor has the same material as a source wiring and a drain wiring of the second transistor.

9. The nitride semiconductor device according to claim 1, wherein
   the first electron transit layer and the second electron transit layer are constituted of a GaN layer, and
   the first electron supply layer and the second electron supply layer include an AlGaN layer.

10. The nitride semiconductor device according to claim 5, wherein
    the first electron transit layer and the second electron transit layer are constituted of a GaN layer,
    the first electron supply layer and the second electron supply layer include an AlGaN layer, and
    the nitride semiconductor gate layer is constituted of a GaN layer which contains an acceptor type impurity.

11. The nitride semiconductor device according to claim 6, wherein the first electron transit layer and the second electron transit layer are constituted of a GaN layer,
the first electron supply layer and the second electron supply layer include an AlGaN layer, and
the gate insulating film is constituted of an SiN film.

12. A method for manufacturing a nitride semiconductor device comprising:
a step of forming on a substrate a first nitride semiconductor layer which constitutes an electron transit layer, a second nitride semiconductor layer which constitutes an electron supply layer and a nitride semiconductor gate layer material film which contains an acceptor type impurity in this order;
a step of forming a first gate electrode film on the nitride semiconductor gate layer material film;
a step of selectively removing the nitride semiconductor gate layer material film and the first gate electrode film, thereby forming a gate portion which is constituted of a ridge-shaped nitride semiconductor gate layer and a first gate electrode formed on an upper surface of the nitride semiconductor gate layer;
a step of forming on a front surface of the second nitride semiconductor layer a separation groove which separates a first transistor forming region from a second transistor forming region, penetrates through the second nitride semiconductor layer and extends to an interior of the first nitride semiconductor layer;
a step of forming a first insulating film which covers an inner surface of the separation groove, an exposed surface of the second nitride semiconductor layer and an exposed surface of the gate portion;
a step of forming a first source electrode and a first drain electrode which penetrate through the first insulating film to reach the second nitride semiconductor layer in the first transistor forming region and forming a second source electrode and a second drain electrode which penetrate through the first insulating film and reach the second nitride semiconductor layer in the second transistor forming region;
a step of forming a second gate electrode on the first insulating film; and
a step of electrically connecting the second gate electrode and the second source electrode to the first gate electrode.

13. The method for manufacturing a nitride semiconductor device according to claim 12, wherein
the step of forming the second gate electrode includes a step of forming an interlayer insulating film on the first insulating film,
a step of forming a gate opening in the interlayer insulating film, and
a step of embedding a metal into the gate opening to form the second gate electrode.

14. The method for manufacturing a nitride semiconductor device according to claim 13, wherein
at the same time as the step of forming the gate opening in the interlayer insulating film, in the interlayer insulating film a first source via-hole, a first drain via-hole, a second source via-hole and a second drain via-hole are formed which respectively reach the first source electrode, the first drain electrode, the second source electrode and the second drain, and the second gate electrode is formed at the same time as a step of embedding a metal into each of the first source via-hole, the first drain via-hole, the second source via-hole and the second drain via-hole, thereby forming a first source wiring, a first drain wiring, a second source wiring and a second drain wiring.

15. The method for manufacturing a nitride semiconductor device according to claim 12, wherein the step of forming the second gate electrode includes
a step of forming a second insulating film on the first insulating film so as to cover the first and the second source electrodes as well as the first and the second drain electrodes,
a step of forming a gate opening in the second insulating film, and
a step of forming the second gate electrode which penetrates through the gate opening and reaches the first insulating film, and
the second gate electrode has a field plate portion which is formed on the second insulating film at a peripheral edge of the gate opening.

16. The method for manufacturing a nitride semiconductor device according to claim 12, wherein the step of forming the second gate electrode includes,
a step of forming a second insulating film on the first insulating film so as to cover the first and the second source electrodes as well as the first and the second drain electrodes,
a step of forming a first gate opening in the second insulating film,
a step of forming an interlayer insulating film on the second insulating film,
a step of forming in the interlayer insulating film a second gate opening which communicates with the first gate opening, and
a step of embedding a metal into a gate opening constituted of the second gate opening and the first gate opening, thereby forming the second gate electrode, and
a width of the second gate opening is larger than a width of the first gate opening, and the second gate electrode has a field plate portion formed on the second insulating film at a peripheral edge of the first gate opening.

17. The method for manufacturing a nitride semiconductor device according to claim 16, wherein
at the same time as the step of forming the second gate opening in the interlayer insulating film, in a laminated film of the second insulating film and the interlayer insulating film, a first source via-hole, a first drain via-hole, a second source via-hole and a second drain via-hole are formed which respectively reach the first source electrode, the first drain electrode, the second source electrode and the second drain, and
the second gate electrode is formed at the same time as a step of embedding a metal into each of the first source via-hole, the first drain via-hole, the second source via-hole and the second drain via-hole, thereby forming a first source wiring, a first drain wiring, a second source wiring and a second drain wiring.

* * * * *